US011085975B2

(12) United States Patent
Wang et al.

(10) Patent No.: US 11,085,975 B2
(45) Date of Patent: Aug. 10, 2021

(54) DROPPED CONDUCTOR SENSOR

(71) Applicants: An-Chyun Wang, Cerritos, CA (US); John McCall, Azusa, CA (US); Keith E. Lindsey, Azusa, CA (US)

(72) Inventors: An-Chyun Wang, Cerritos, CA (US); John McCall, Azusa, CA (US); Keith E. Lindsey, Azusa, CA (US)

(73) Assignee: LINDSEY MANUFACTURING CO., Azusa, CA (US)

( * ) Notice: Subject to any disclaimer, the term of this patent is extended or adjusted under 35 U.S.C. 154(b) by 0 days.

(21) Appl. No.: 15/485,168

(22) Filed: Apr. 11, 2017

(65) Prior Publication Data
US 2017/0350932 A1 Dec. 7, 2017

Related U.S. Application Data

(60) Provisional application No. 62/321,124, filed on Apr. 11, 2016.

(51) Int. Cl.
| | |
|---|---|
| *G01R 31/58* | (2020.01) |
| *G01P 15/08* | (2006.01) |
| *G01H 1/00* | (2006.01) |
| *G01R 31/08* | (2020.01) |
| *G01P 15/00* | (2006.01) |
| *H02G 7/18* | (2006.01) |

(52) U.S. Cl.
CPC .............. *G01R 31/58* (2020.01); *G01H 1/00* (2013.01); *G01P 15/0891* (2013.01); *G01R 31/085* (2013.01); *H02G 7/18* (2013.01); *G01P 15/00* (2013.01)

(58) Field of Classification Search
CPC ...... G01R 31/021; G01R 31/085; G01H 1/00; H02G 7/18
See application file for complete search history.

(56) References Cited

U.S. PATENT DOCUMENTS

| | | | |
|---|---|---|---|
| 4,745,539 | A | 5/1988 | Nilssen |
| 8,067,946 | B2 | 11/2011 | Muench, Jr. et al. |

(Continued)

FOREIGN PATENT DOCUMENTS

JP    H04 75412 A    3/1992

OTHER PUBLICATIONS

International Search Report from corresponding International Application No. PCT/US2017/027072, International Search Report dated Jun. 6, 2017 and mailed Jun. 7, 2017 (2 pgs.).

(Continued)

*Primary Examiner* — Tung X Nguyen
*Assistant Examiner* — Feba Pothen
(74) *Attorney, Agent, or Firm* — Lewis Roca Rothgerber Christie LLP

(57) ABSTRACT

A dropped conductor sensor includes a housing installable on a first conductor; a sensor supported in the housing and configured to sense in real time at least one of an acceleration, a vibration, a tilt, a roll, or an angular displacement of the dropped conductor sensor; and an antenna in the housing, the antenna configured to transmit a signal including information sensed by the sensor away from the dropped conductor sensor in real time. A monitoring system including a dropped conductor sensor, and a method of monitoring a conductor using a dropped conductor sensor are also provided.

16 Claims, 21 Drawing Sheets

(56) References Cited

U.S. PATENT DOCUMENTS

| | | |
|---|---|---|
| 2006/0060007 A1 | 3/2006 | Mekhanoshin et al. |
| 2008/0077336 A1 | 3/2008 | Fernandes |
| 2011/0011987 A1* | 1/2011 | Lessard .................. H02G 1/04 |
| | | 248/49 |
| 2012/0278011 A1 | 11/2012 | Lancaster |
| 2014/0136140 A1 | 5/2014 | Chan et al. |
| 2014/0266237 A1 | 9/2014 | Lindsey et al. |
| 2014/0375302 A1 | 12/2014 | Davis |
| 2016/0061603 A1* | 3/2016 | Phillips .................. G01C 9/02 |
| | | 33/365 |

OTHER PUBLICATIONS

Written Opinion of the International Searching Authority from corresponding International Application No. PCT/US2017/027072, dated Jun. 19, 2017 (5 pgs.).

Extended European Search Report for corresponding European Application No. 17783013.0, Extended European Search Report dated Oct. 1, 2019 (11 pgs.).

* cited by examiner

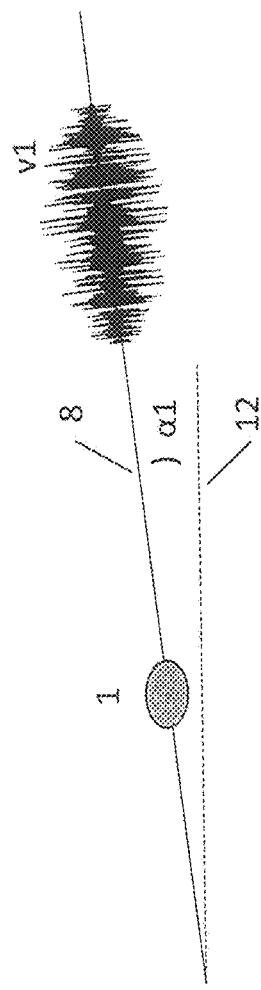
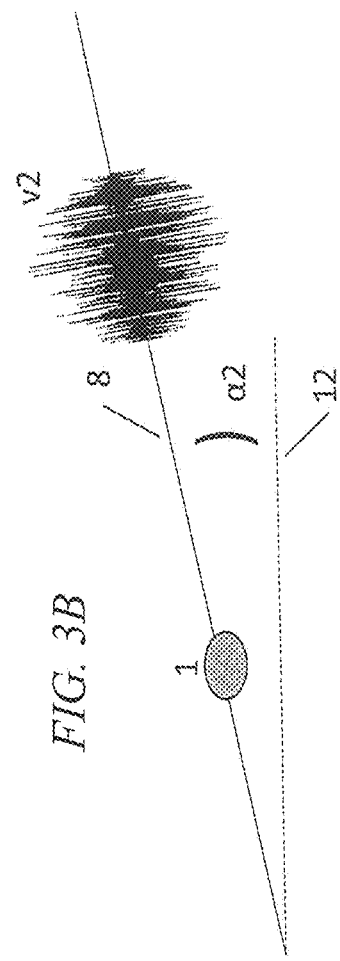

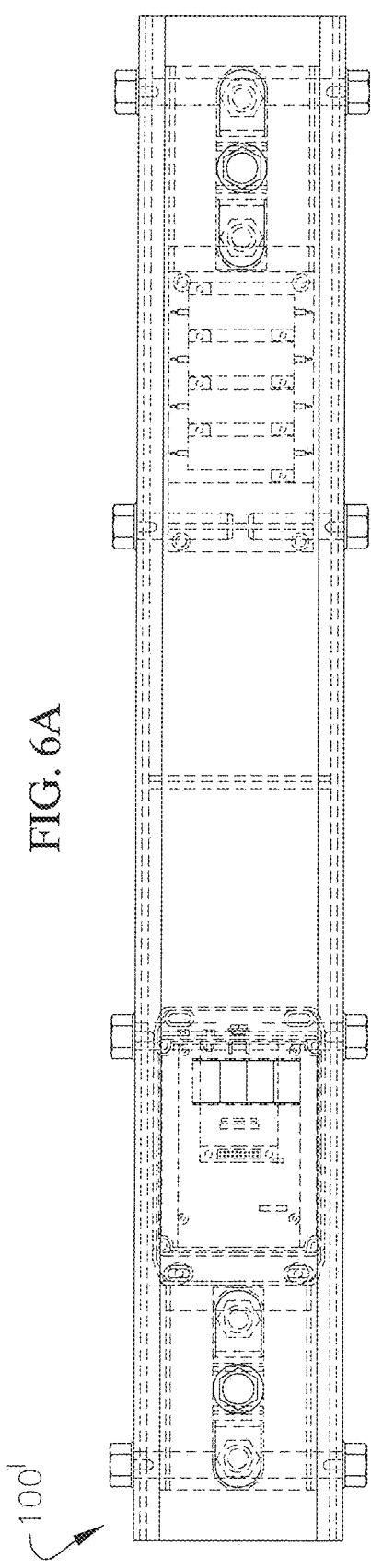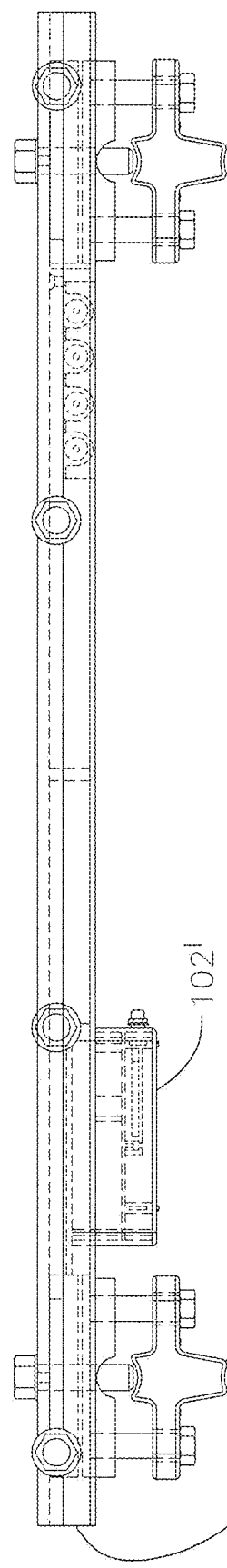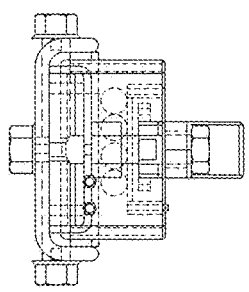
FIG. 6A
FIG. 6B
FIG. 6C

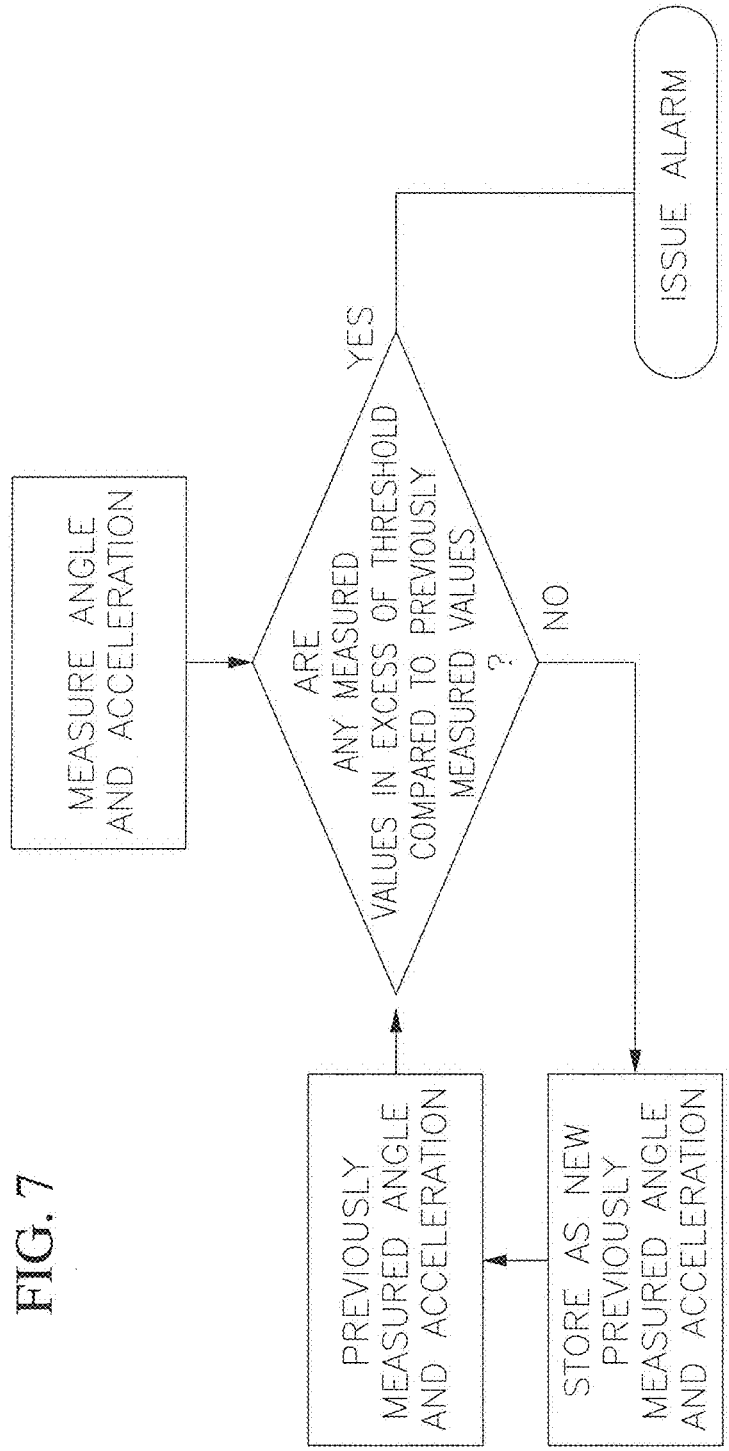

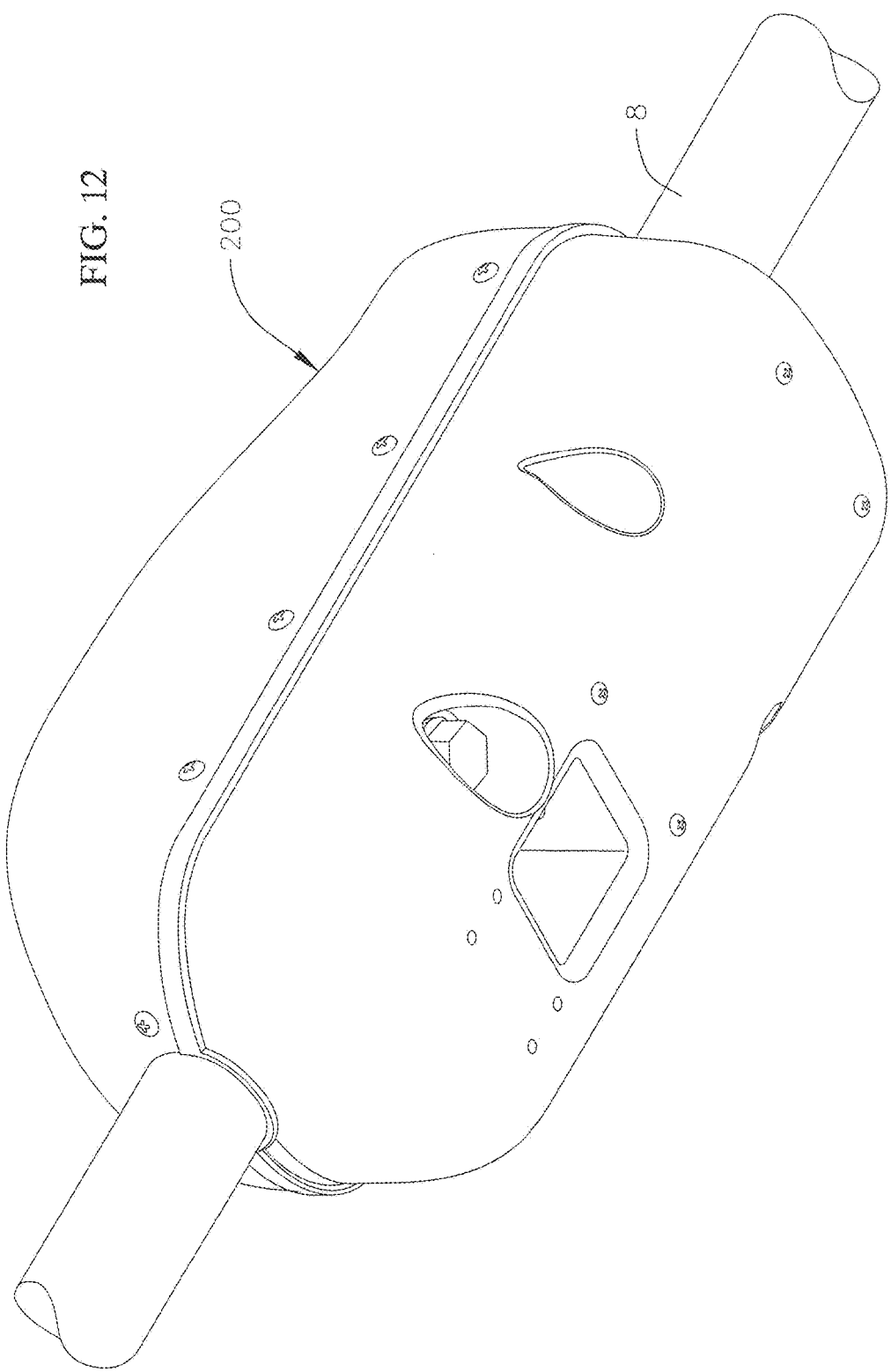

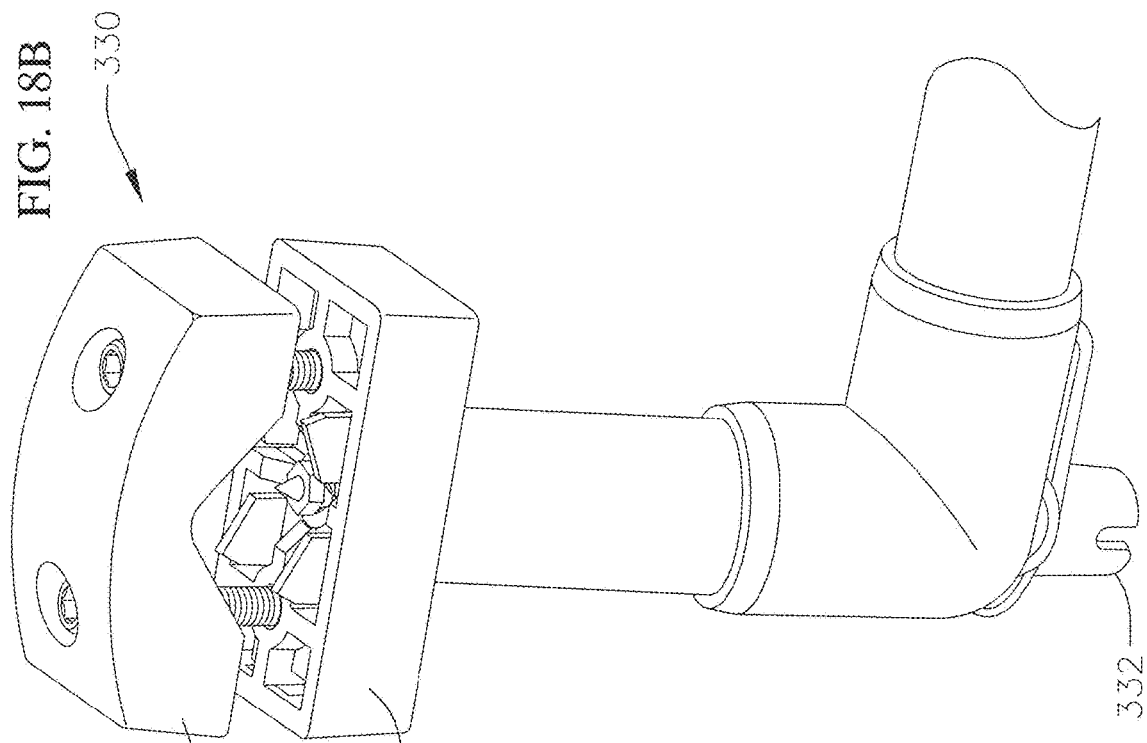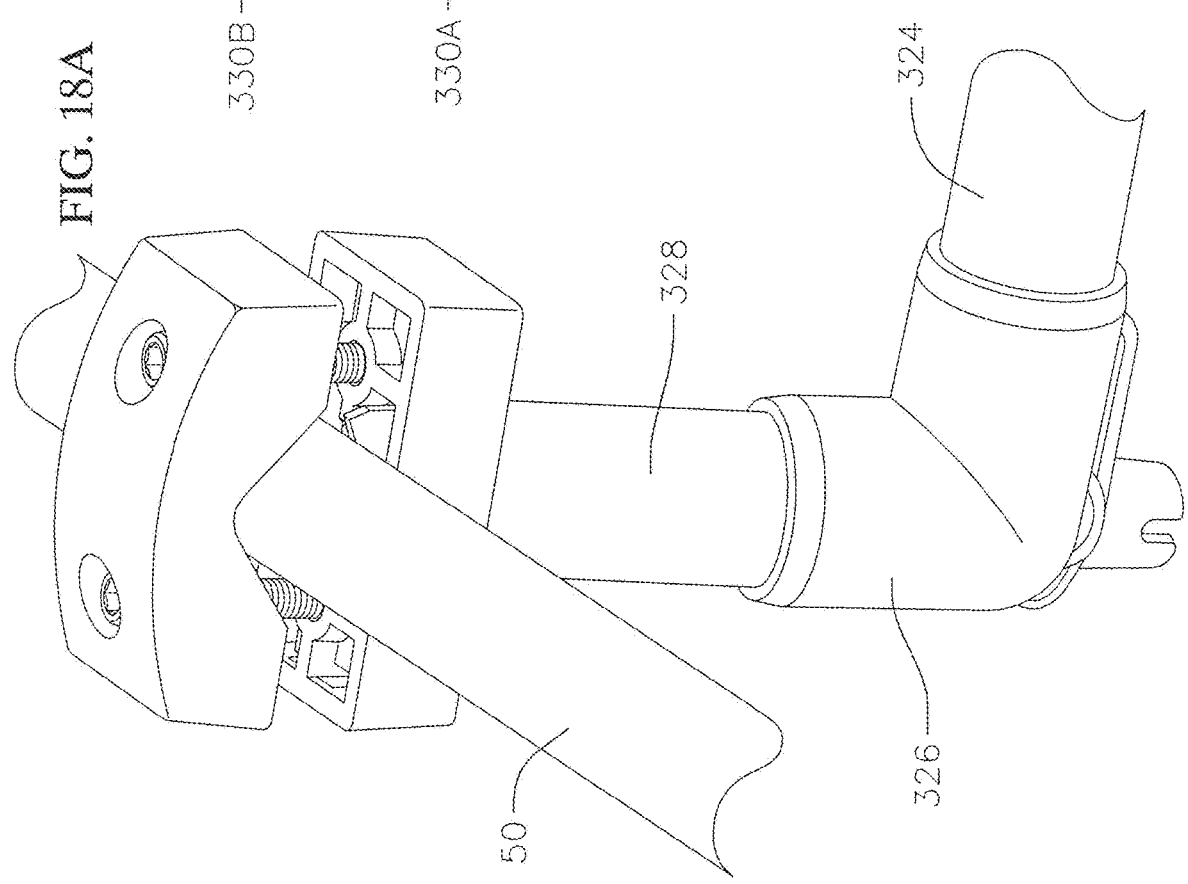

DROPPED CONDUCTOR SENSOR

CROSS-REFERENCE TO RELATED APPLICATION

This application claims the benefit of U.S. Provisional Patent Application Ser. No. 62/321,124, filed on Apr. 11, 2016, the entire content of which is hereby incorporated by reference.

FIELD

Aspects of embodiments of the present invention relate to a dropped conductor sensor, and a system and method for monitoring a conductor using the same.

BACKGROUND

Conductors may be provided in an electric distribution system, such as for providing power to homes or businesses. For example, single-phase or three-phase high voltage AC power may be supplied via a set of two to four conductors which may or may not include a ground or neutral conductor. The conductors may be copper conductors, and, in one example, may be spaced apart from each other by a distance of some feet based upon the actual voltage. Also, conductors may be provided in an electric distribution system for powering vehicles. For example, vehicles such as trolleys, buses, or trains may be powered through a pair of overhead conductors spaced apart from each other by a distance. As an example, DC power may be supplied via conductors, such as a pair of copper conductors spaced apart from each other.

In the event that a conductor of an electric distribution system is downed, or dropped, such as due to inclement weather or theft, for example, it may be difficult to detect the state of the dropped conductor. As a dropped conductor is disruptive to a corresponding application and may also create a dangerous situation, such as presenting a live, life-threatening voltage to the general public, it is desirable to be able to quickly detect a dropped conductor, as well as monitor and/or provide a warning of such an event.

SUMMARY

According to an aspect of embodiments of the present invention, a dropped conductor sensor is configured to detect a dropped conductor by sensing a change in acceleration, angular displacement, or vibration. According to another aspect of embodiments of the present invention, a dropped conductor sensor is configured to send a signal via an antenna to provide information about the dropped conductor sensor. According to another aspect of embodiments of the present invention, a dropped conductor sensor is configured to provide information regarding a location of the dropped conductor sensor so that personnel may quickly locate and restore an associated conductor.

According to an exemplary embodiment of the present invention, a dropped conductor sensor includes: a housing installable on a first conductor; and a sensor supported in the housing and configured to sense in real time at least one of an acceleration, a vibration, a tilt, a roll, or an angular displacement of the dropped conductor sensor.

The dropped conductor sensor may further include an antenna in the housing, the antenna configured to transmit a signal including information sensed by the sensor away from the dropped conductor sensor in real time.

The dropped conductor sensor may be configured to derive power for the sensor's use from the conductors to which it is connected, and may further include a DC/DC or AC/DC converter electrically connected between the first conductor and the sensor. The dropped conductor sensor may further include a current limiting resistor electrically connected between the DC/DC or AC/DC converter and the sensor.

The housing may include a supporting portion configured to support the dropped conductor sensor from the first conductor. The supporting portion may have at least one of a hook shape or a clamp shape having a recess configured to receive the first conductor. The supporting portion may include an electrically conductive material and may be electrically connected between the first conductor and the sensor.

The housing may be installable on both the first conductor and a second conductor and configured to bridge a gap between the first conductor and the second conductor. The dropped conductor sensor may include a pair of clamping portions configured to clamp on the first conductor and the second conductor. Each of the pair of clamping portions may be rotatably coupled to the housing.

The sensor may include an accelerometer.

The housing may include a base portion, and a cover portion coupled to the base portion and defining a cavity of the housing together with the base portion, and the sensor and the antenna may be housed in the cavity. The base portion and the cover portion may be electrically insulative.

According to another exemplary embodiment of the present invention, a monitoring system includes: a dropped conductor sensor including a housing installable on a conductor, a sensor supported in the housing and configured to sense in real time at least one of an acceleration, a vibration, a tilt, a roll, or an angular displacement of the dropped conductor sensor, and an antenna in the housing, the antenna configured to transmit a signal including information sensed by the sensor away from the dropped conductor sensor in real time; and a remote receiving device receiving the signal from the dropped conductor sensor.

The remote receiving device may include at least one of a monitoring station, a satellite, or another dropped conductor sensor.

According to another exemplary embodiment of the present invention, a method of monitoring a conductor using a dropped conductor sensor includes: providing a dropped conductor sensor on a first conductor; sensing in real time at least one of an acceleration, a vibration, a tilt, a roll, or an angular displacement of the dropped conductor sensor using a sensor of the dropped conductor sensor; and transmitting a signal including information sensed using the sensor to a remote receiving device in real time.

Providing the dropped conductor sensor on the first conductor may include supporting the dropped conductor sensor on the first conductor, and the method may further include supporting the dropped conductor sensor on a second conductor that is spaced apart by a gap from the first conductor. Supporting the dropped conductor sensor on the first and second conductors may include bridging the dropped conductor sensor across the gap between the first conductor and the second conductor. Supporting the dropped conductor sensor on the first and second conductors may include clamping respective supporting portions of the dropped conductor sensor on each of the first and second conductors.

The remote receiving device may include at least one of a monitoring station, a satellite, or another dropped conductor sensor.

BRIEF DESCRIPTION OF THE DRAWINGS

The above and other features, aspects, and advantages of the present invention will become better understood with regard to the following description, appended claims, and accompanying drawings where:

FIGS. 3A and 3B show changes of angles and vibrations sensed by a dropped conductor sensor according to an embodiment of the present invention;

FIGS. 6A, 6B, and 6C are a top view, a front view, and a side view, respectively, of a dropped conductor sensor according to another embodiment of the present invention;

FIG. 7 is a block diagram showing operations of a dropped conductor sensor according to an embodiment of the present invention;

FIG. 12 is a bottom perspective view of the dropped conductor sensor of FIG. 11, shown mounted on a conductor;

FIGS. 18A and 18B are perspective views of a clamping portion of the dropped conductor sensor of FIG. 16.

DETAILED DESCRIPTION

In the following detailed description, certain exemplary embodiments of the present invention are shown and described, by way of illustration. As those skilled in the art would recognize, the described exemplary embodiments may be modified in various ways without departing from the spirit and scope of the present invention. Accordingly, the drawings and description are to be regarded as illustrative in nature, rather than restrictive.

Figure 1:
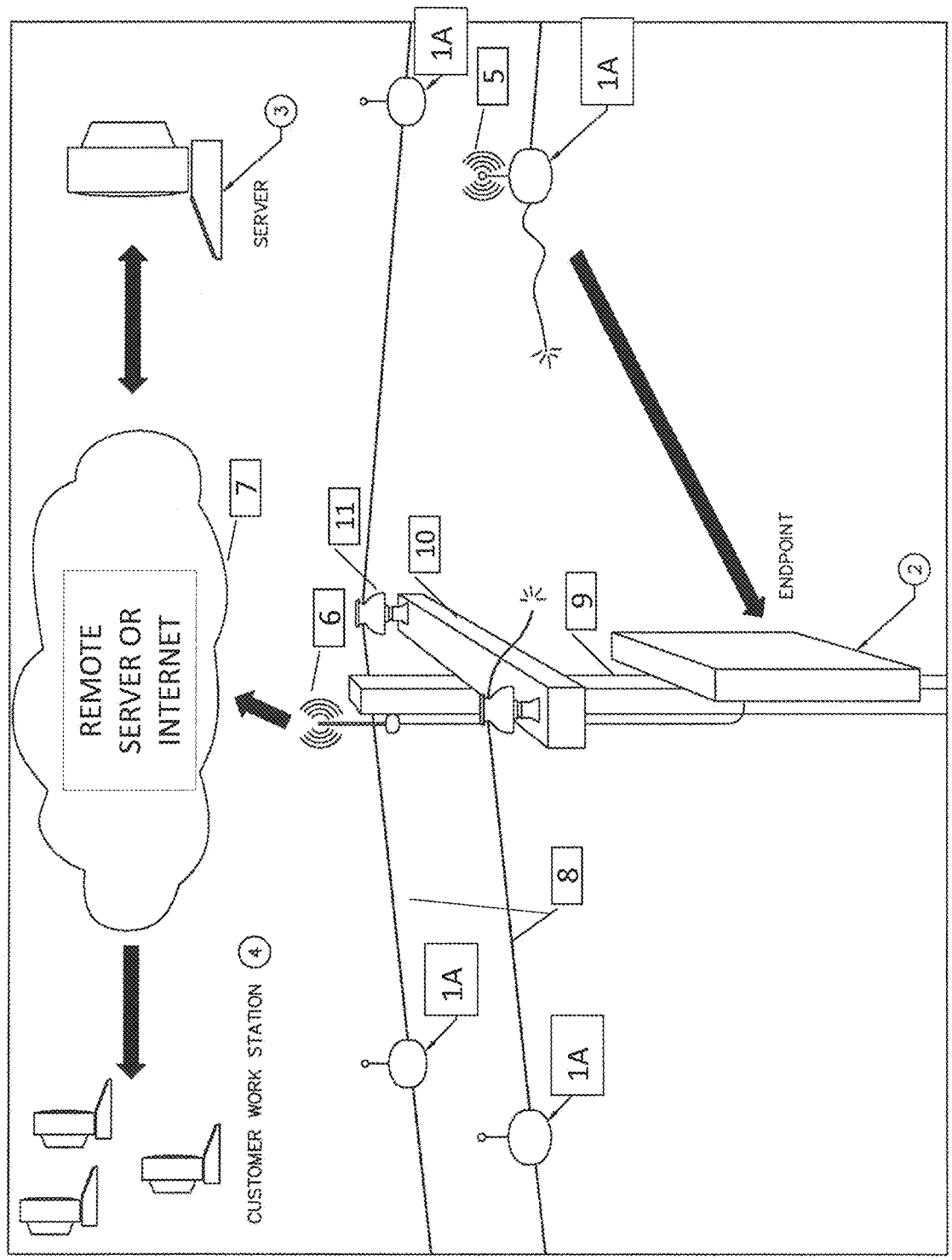
FIG. 1 is a schematic view of a dropped conductor sensor and system according to an embodiment of the present invention.
Figure 2:
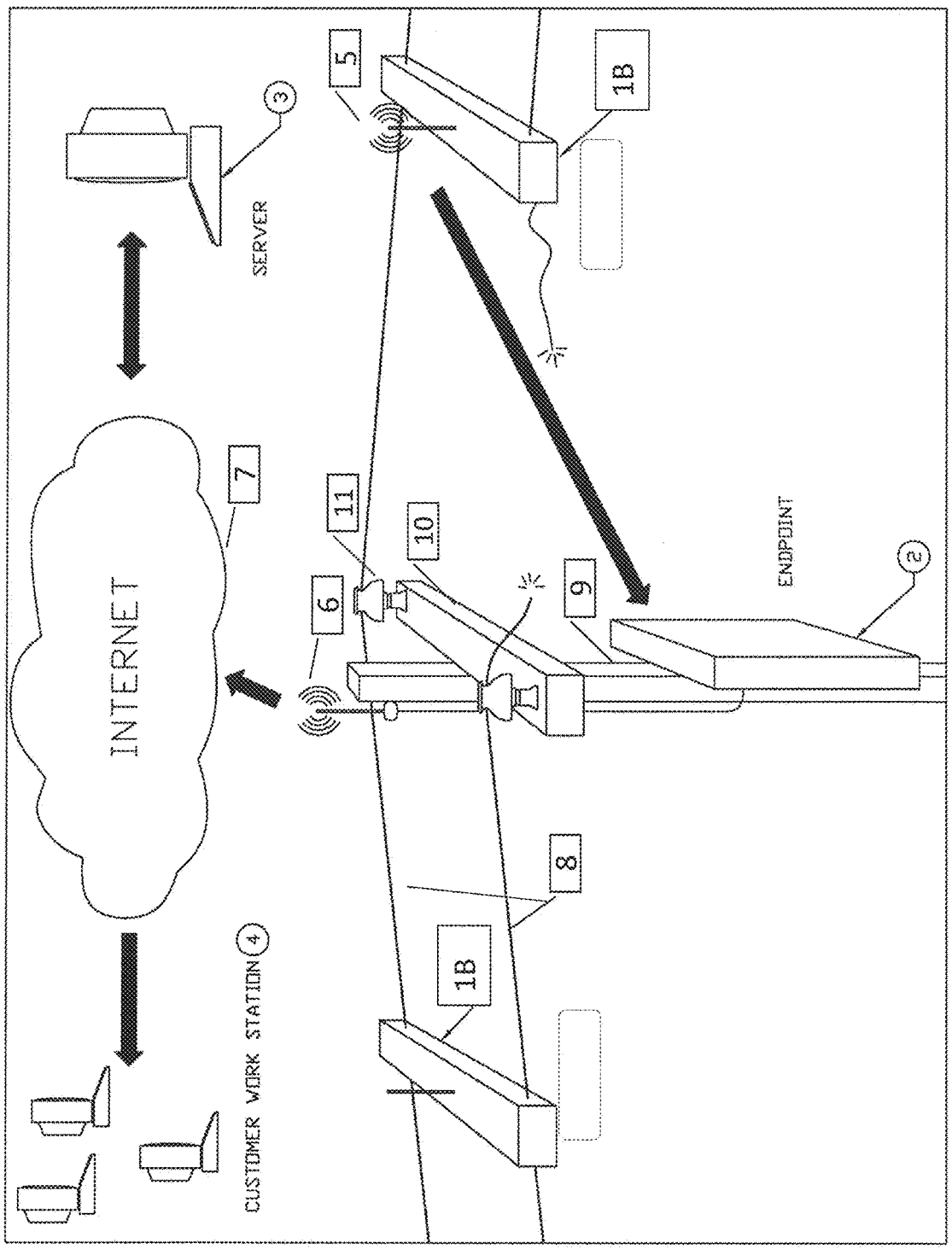
FIG. 2 is a schematic view of a dropped conductor sensor and system according to another embodiment of the present invention.

With reference to FIG. 1, a dropped conductor sensor 1A, according to an embodiment of the present invention, is shown mounted or supported on an individual conductor or wire 8. With reference to FIG. 2, a dropped conductor sensor 1B, according to another embodiment of the present invention, is shown mounted or supported across two conductors or wires 8. In another embodiment, a dropped conductor sensor may be supported across more than two conductors or wires (not shown). Although a conductor or wire may be described herein as a "conductor," "a wire," or a "transmission line," for example, embodiments of the present invention may be applied to electric power conductors (AC or DC), telephony wires, fiber optic cables, coaxial cables, or structural cables, for example. Further, while a sensor may be described herein as a "dropped conductor sensor," a sensor according to embodiments of the present invention may be configured to detect acceleration, vibration, tilt, roll, angular displacement, and/or a change in one or more of these properties. For example, in one embodiment, a sensor may be configured to detect a vibration, an amount of vibration, or a change in vibration, but may not be configured to detect a "drop." In another embodiment, for example, a sensor may be configured to detect a drop, such as by an acceleration, an angular displacement, or a change thereof.

The dropped conductor sensor 1A, 1B includes at least one of a vibration detector, an accelerometer, or an angular displacement detector. The electrical conductors or wires 8 may be connected to, or mounted on, a utility pole structure including a pole 9, a crossarm 10, and insulators 11; however, embodiments of the present invention are not limited thereto, and, in other embodiments, the conductors or wires 8 may be supported by any other suitable device or method. Further, the sensor 1A, 1B may draw power from the conductor or wire 8 to which is it attached, or from a battery, a solar cell, or any other local or remote power source.

FIGS. 3A and 3B illustrate changes of angles and vibrations sensed by a dropped conductor sensor according to an embodiment of the present invention. In an embodiment, a sensor 1, such as one of the sensors 1A and 1B described above, may continuously detect a first vibration (v1) and/or a first angular displacement ($\alpha$1) of the conductor or wire 8 from a plane 12 (e.g., a horizontal plane) (see FIG. 3A). The sensor 1 may detect a second vibration (v2) and/or a second angular displacement ($\alpha$2) (see FIG. 3B) and periodically compare the second vibration (v2) against the previously detected first vibration (v1) and/or compare the second angular displacement ($\alpha$2) against the previously detected first angular displacement ($\alpha$1), such as in the sensor 1 itself or by remote software. In one embodiment, where the change in angular displacement ($\alpha$2−$\alpha$1) exceeds a predetermined value for a predetermined period of time, for example, an alarm may be issued by the sensor or the remote software indicating the conductor or wire has been damaged, broken, or removed, such as due to theft or vandalism, for example. In one embodiment, where the detected vibration (v2) matches the characteristics of a predetermined vibration pattern for a predetermined period of time, for example, an alarm may be issued by the sensor or the remote software indicating the conductor or wire is possibly being tampered with, such as by cutting, sawing, or clipping, for example.

The sensor may communicate the detected vibration and/or angular displacement information, and any alarms that the sensor may compute locally, by a connected radio 5, either directly or via an intermediary communication device 2 and associated radio 6, to a remote computer 4, a remote server 3, and/or to the internet 7. The radios or antennas 5 and 6 may be of any suitable frequency and, in one embodiment, may be configured to communicate to and/or from a satellite.

Figure 4A:
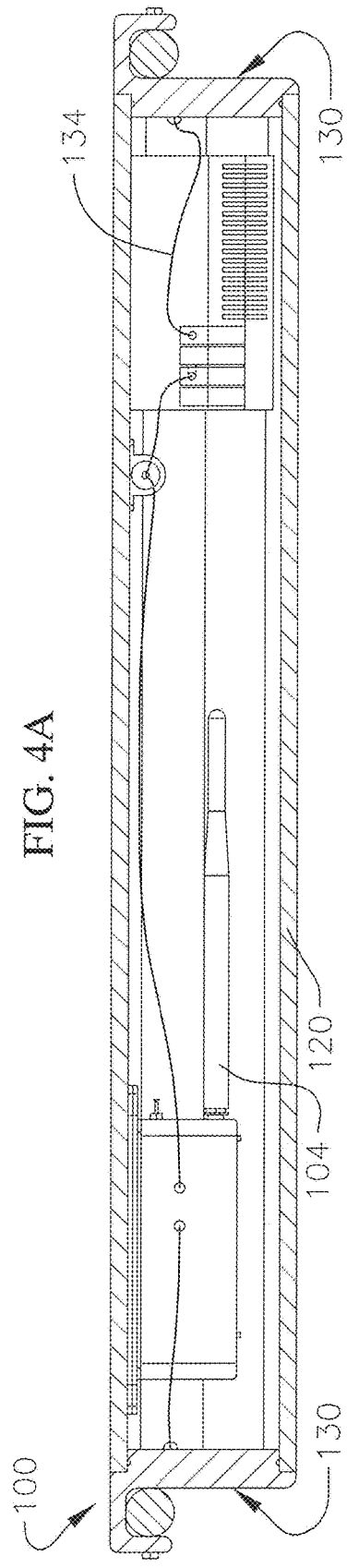
FIGS. 4A, 4B, and 4C are a cross-sectional view, a top view, and a side view, respectively, of a dropped conductor sensor according to an embodiment of the present invention.
Figure 4B:
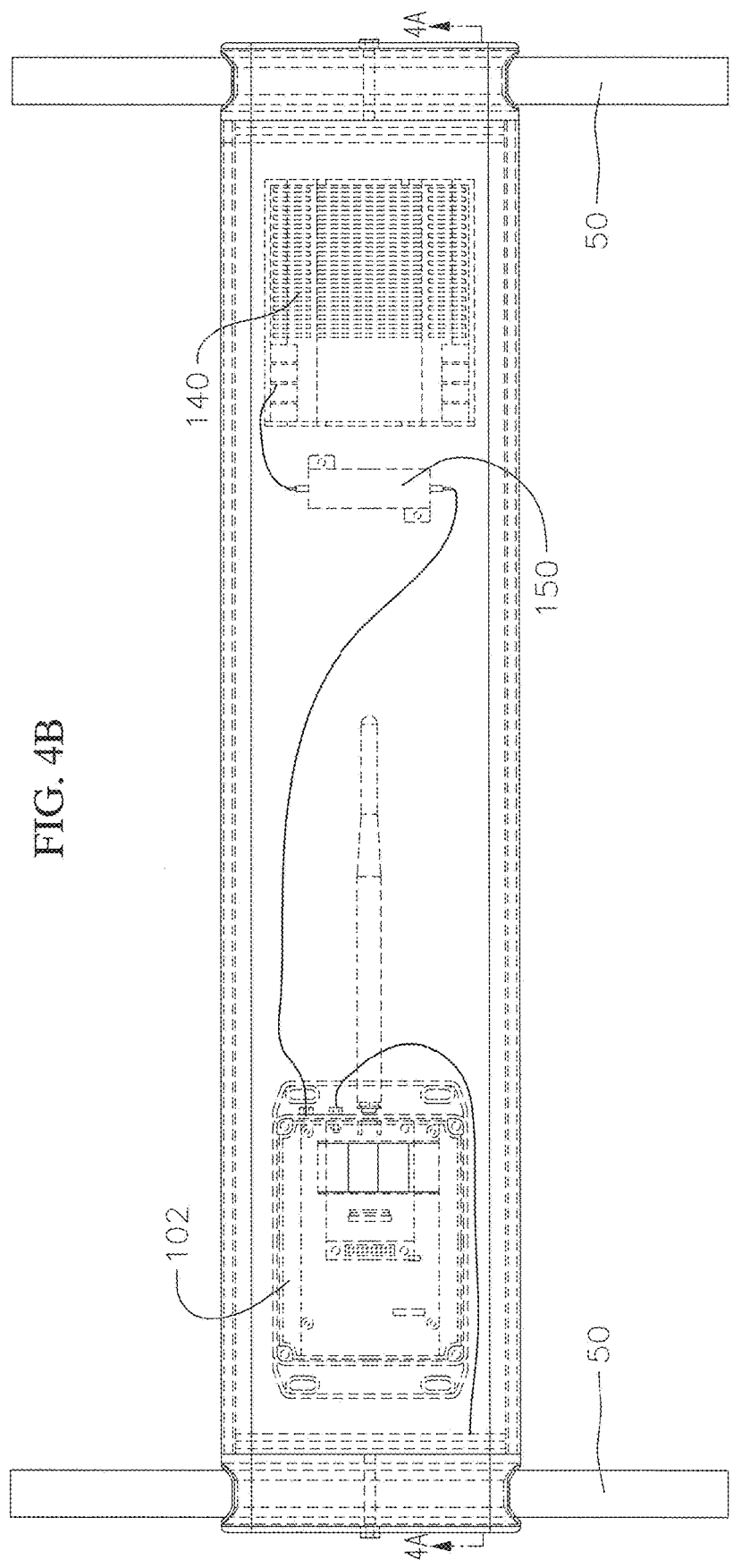
Figure 4C:
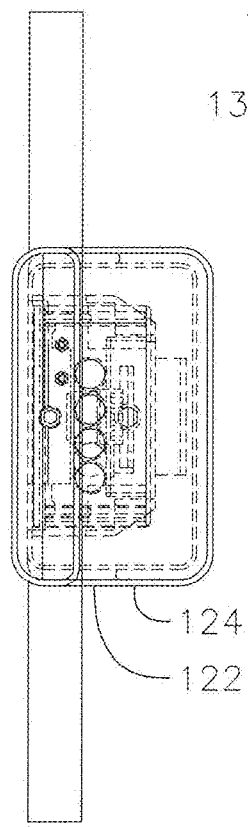

With reference to FIGS. 4A to 4C, a dropped conductor sensor 100, according to an embodiment of the present invention, includes a housing 120, a sensor 102 configured to sense in real time at least one of an acceleration, a vibration, a tilt, a roll, or an angular displacement of the dropped conductor sensor 100. The dropped conductor sensor, in one embodiment, further includes an antenna 104 configured to transmit a signal including information sensed by the sensor 102 away from the dropped conductor sensor 100 in real time. The housing 120 is installable on a conductor 50, such as via a supporting portion 130. The sensor 102 and the antenna 104 may be housed in a cavity of the housing 120, and, in one embodiment, the sensor 102 may be housed in a sensor housing that is mounted within the cavity of the housing 120. In one embodiment, the sensor 102 is configured to measure an acceleration of the dropped conductor sensor 100 such that a sudden drop of the conductor 50 from which the dropped conductor sensor 100 is supported may be detected, and the sensor 102 may be a microelectromechanical system (MEMS) accelerometer. However, the present invention is not limited thereto and, in other embodiments, the sensor 102 may include one or more sensors configured to measure at least one of an acceleration, a vibration, a tilt, a roll, or an angular displacement of the dropped conductor sensor 100.

The housing 120 may be insulative, such as formed of a thermoplastic material or fiberglass. In one embodiment, the housing 120 includes an upper housing portion 122 and a lower housing portion 124 coupled thereto and together defining a cavity to house the sensor 102 and the antenna 104. In one embodiment, one of the upper housing portion 122 or the lower housing portion 124 may include a protrusion and the other of the upper housing portion 122 or the lower housing portion 124 may have a groove to receive the protrusion. In one embodiment, each of the upper housing portion 122 and the lower housing portion 124 may have a protrusion and a groove, such as on opposite sides thereof. However, embodiments of the present invention are not limited thereto, and, in other embodiments, the upper housing portion 122 and the lower housing portion 124 may be coupled by any other suitable device or method or, alternatively, the housing 120 may be made of an integral member, such as a cylindrical or tubular member.

The dropped conductor sensor 100 is configured to be supported from the conductor 50. In one embodiment, the dropped conductor sensor 100 is configured to be supported at one side from a first conductor 50 and at another side from a second conductor 50. As such, the dropped conductor sensor 100 may bridge a gap between the first and second conductors 50 such that if one or both of the first and second conductors 50 drops, the dropped conductor sensor 100 will detect the drop. In one embodiment, the first and second conductors 50 may be parallel to each other and spaced apart by approximately two feet; however, embodiments of the present invention are not limited thereto.

Figure 5A:
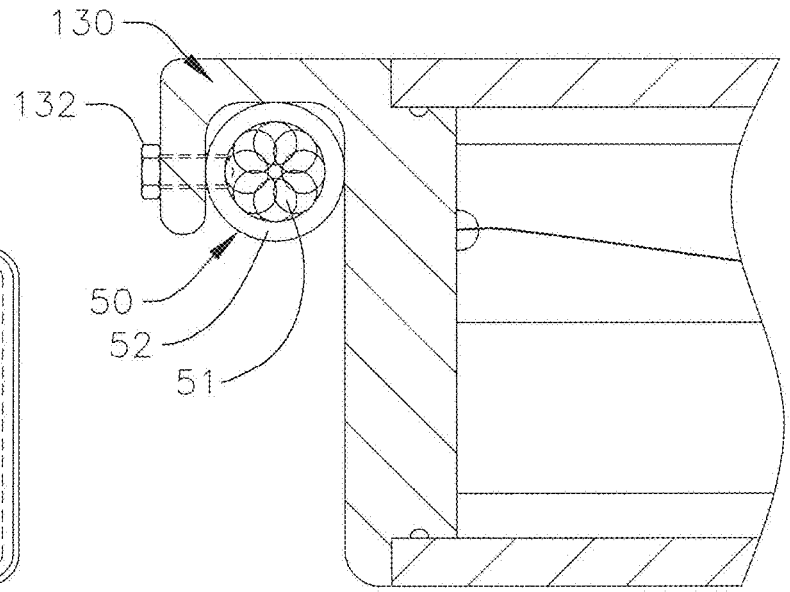
FIGS. 5A and 5B show details of mounting structures of a dropped conductor sensor, according to various embodiments of the present invention.
Figure 5B:
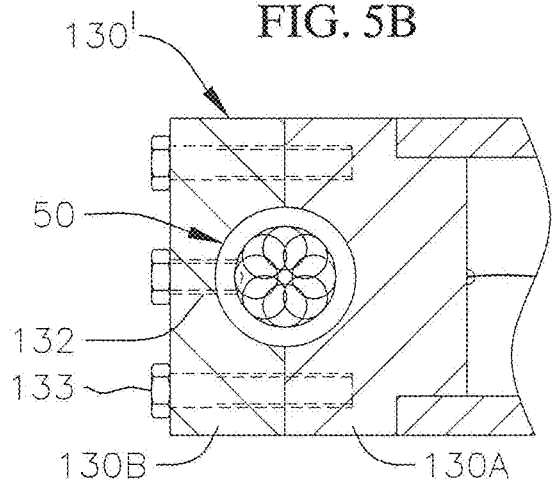

The dropped conductor sensor 100 may include a supporting portion 130 coupled to the housing 120 and configured to engage, receive, or otherwise be supported on or from the conductor 50. For example, as shown in FIG. 5A, the supporting portion 130 may have a hook shape, in one embodiment, having a recess configured to receive the conductor 50. In another embodiment, as shown in FIG. 5B, a supporting portion 130' may be configured to clamp to the conductor 50 and may include a base portion 130A and a clamping portion 130B configured to be moved relative to the base portion 130A and clamp the conductor 50 therebetween, such as via one or more fasteners 133. Further, the supporting portion 130, 130' may be electrically conductive (e.g., a metal) and may include a connector 132 to electrically connect to a core 51 (e.g., a copper core) of the conductor 50, such as by piercing an insulative jacket 52 of the conductor 50. In an embodiment, the dropped conductor sensor 100 includes a first supporting portion 130 coupled to a first end of the housing 120 and configured to engage, receive, or otherwise be supported on or from the first conductor 50, and a second supporting portion 130 coupled to a second end of the housing 120 and configured to engage, receive, or otherwise be supported on or from the second conductor 50.

In an embodiment, the dropped conductor sensor 100 is electrically connected to the conductor 50 such that the sensor 102 may be powered by the conductor 50. In an embodiment, the conductor is a 600 V DC copper conductor; however, embodiments of the present invention are not limited thereto. The dropped conductor sensor 100 may include a step-down device 140, such as a 600 V DC to 24 V DC converter, electrically connected, such as via wiring 134 between the conductor 50 and the sensor 102. Further, the dropped conductor sensor 100 may include a current limiting resistor 150 electrically connected between the step-down device 140 and the sensor 102.

According to an embodiment, the dropped conductor sensor 100 may further include a GPS or similar positioning device configured to provide information of the location of the dropped conductor sensor 100. For example, in a system including a plurality of the dropped conductor sensors 100, a GPS or similar positioning device would allow a user to quickly and easily locate and repair the conductor 50 associated with the particular dropped conductor sensor 100.

With reference to FIGS. 6A to 6C, a dropped conductor sensor 100', according to another embodiment of the present invention, may include a supporting portion 135 configured to clamp to a conductor, for example. Further, in an embodiment, the dropped conductor sensor 100' may include a housing 120' that is open at a lower side, and a sensor 102' that may be housed in a sensor housing on the lower side of the housing 120'. For example, the housing 120' may have a channel shape or other suitable configuration.

A block diagram showing operations of a dropped conductor sensor, such as one of the dropped conductor sensors 100, 100' described above, according to an embodiment of the present invention, is shown in FIG. 7.

Figure 8:
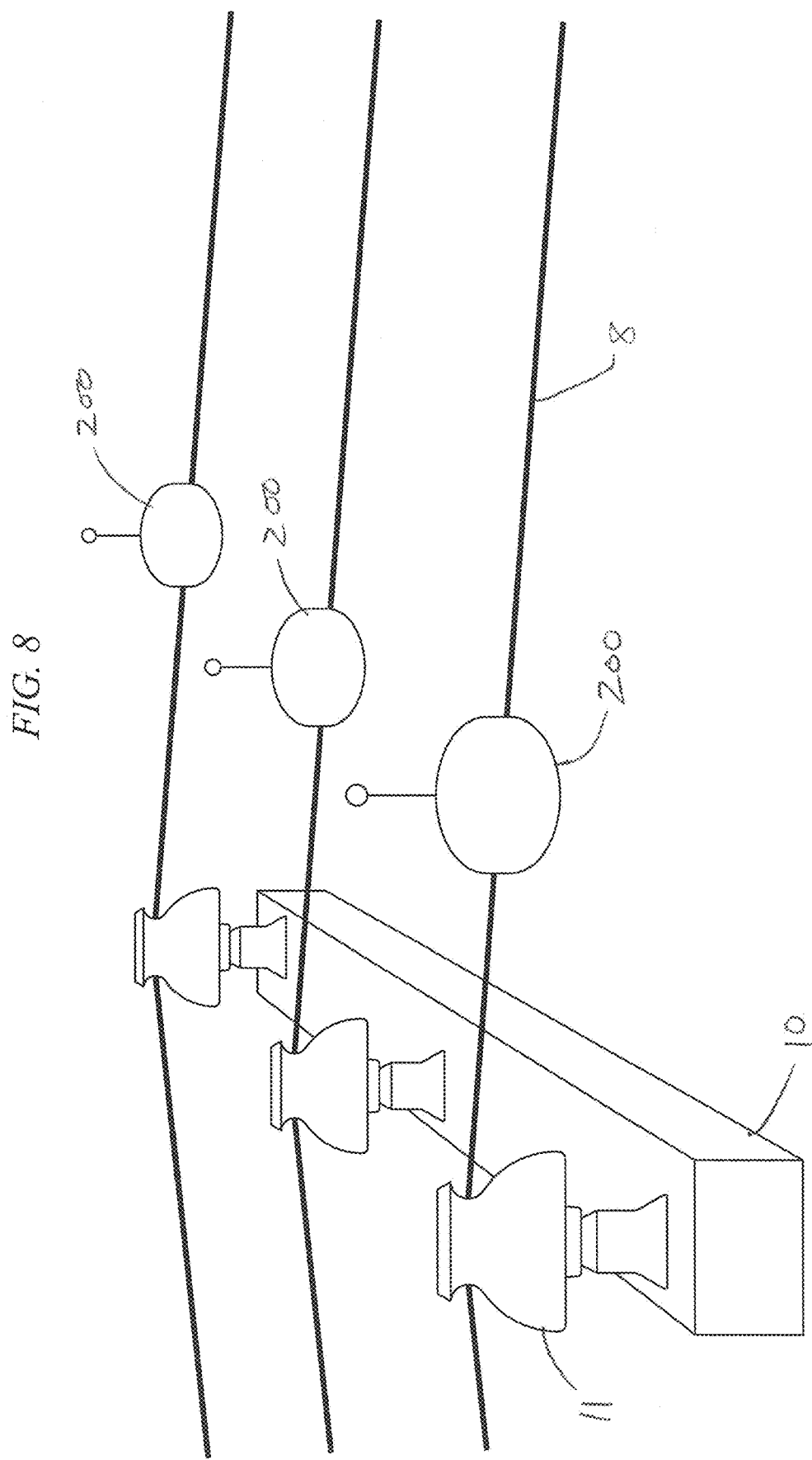
FIG. 8 is a schematic diagram showing dropped conductor sensors according to another embodiment of the present invention.
Figure 9:
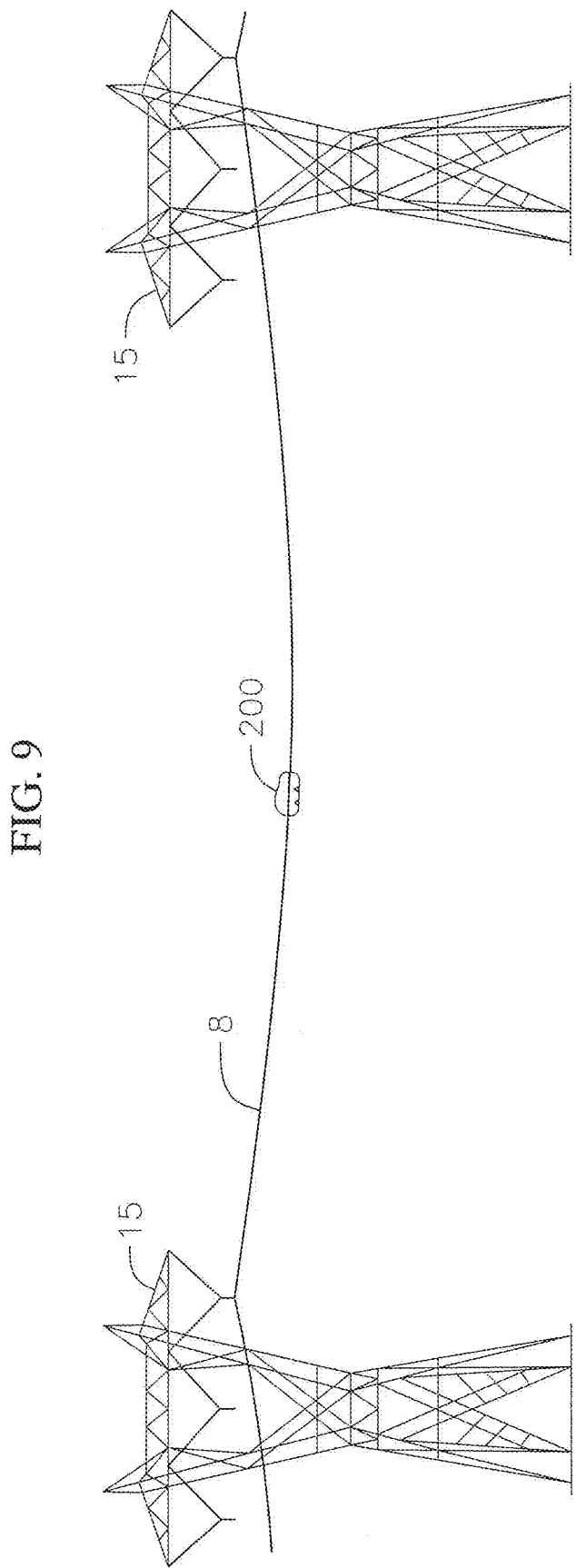
FIG. 9 is a schematic view showing a dropped conductor sensor according to another embodiment of the present invention.
Figure 10:
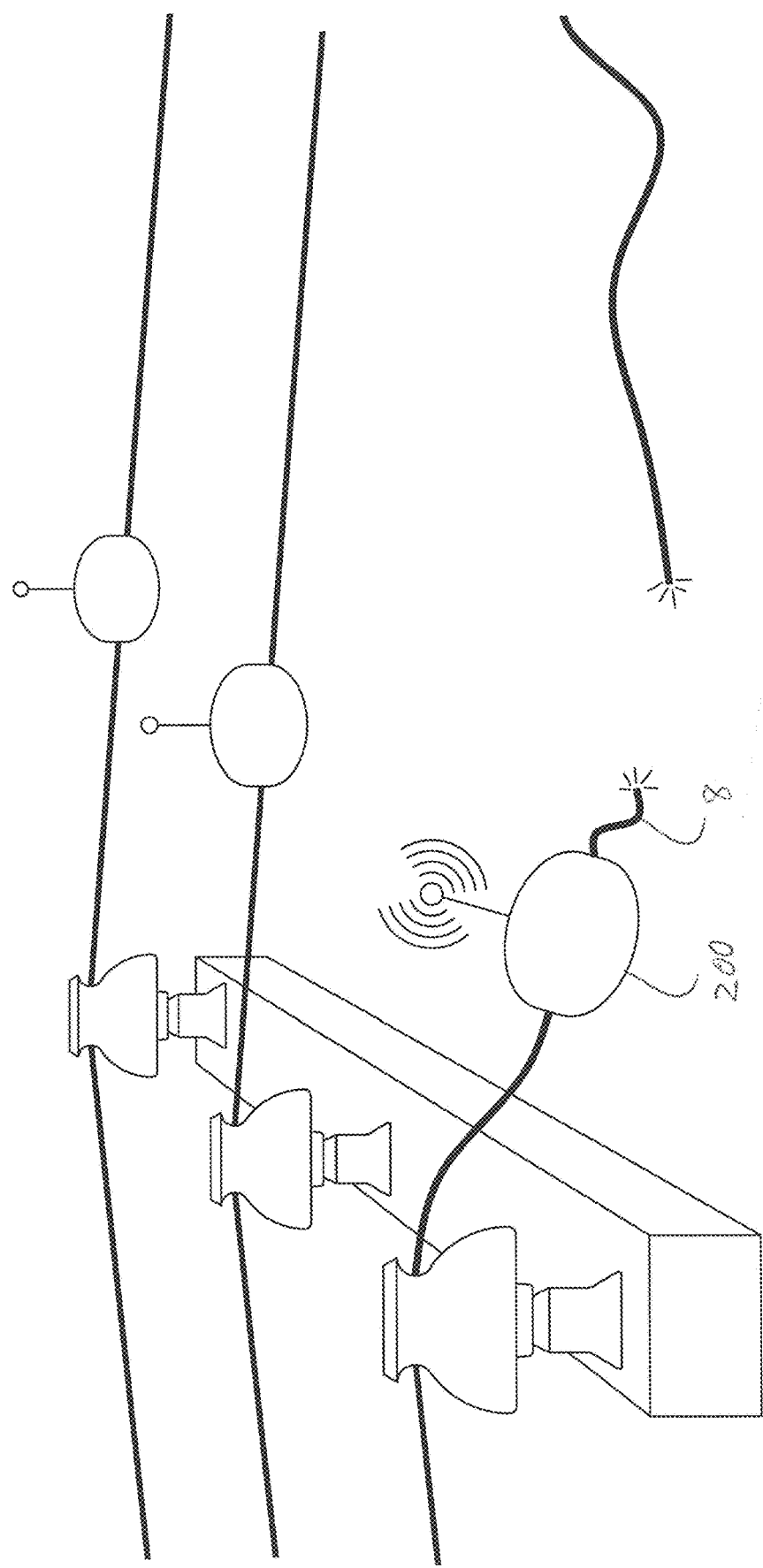
FIG. 10 is a schematic view showing a dropped conductor sensor sending a signal upon detection of a dropped conductor, according to an embodiment of the present invention.

With reference to FIGS. 8-14, a dropped conductor sensor 200 according to another embodiment of the present invention is shown. As depicted in FIG. 8, the dropped conductor sensor 200 may be installed on a conductor 8. As used herein, the term "conductor" includes a high voltage transmission line, such as an AC distribution or transmission line having any voltage AC or DC. With reference to FIG. 8, the conductor 8 may be supported by a crossarm 10 and insulators 11. With reference to FIG. 9, the conductor 8 may be supported by a tower 15. The dropped conductor sensor 200 may sense an acceleration of the conductor 8, such as when the conductor 8 drops unexpectedly, which may otherwise be difficult to detect. With reference to FIG. 6, the dropped conductor sensor 200 is shown installed on the conductor 8, according to an embodiment of the present invention. In one embodiment, the dropped conductor sensor 200 may be installed at a location along the conductor 8 that is supported by a pair of the towers 15. For example, the dropped conductor sensor 200 may be installed on the conductor 8 at a location that is equidistant or substantially equidistant from the towers 15, as depicted in FIG. 9; however, the present invention is not limited thereto. FIG. 10 depicts the dropped conductor sensor 200 sending a signal upon detection of a dropped conductor, such as a dropped state of the conductor 8 due to breakage.

Figure 11:
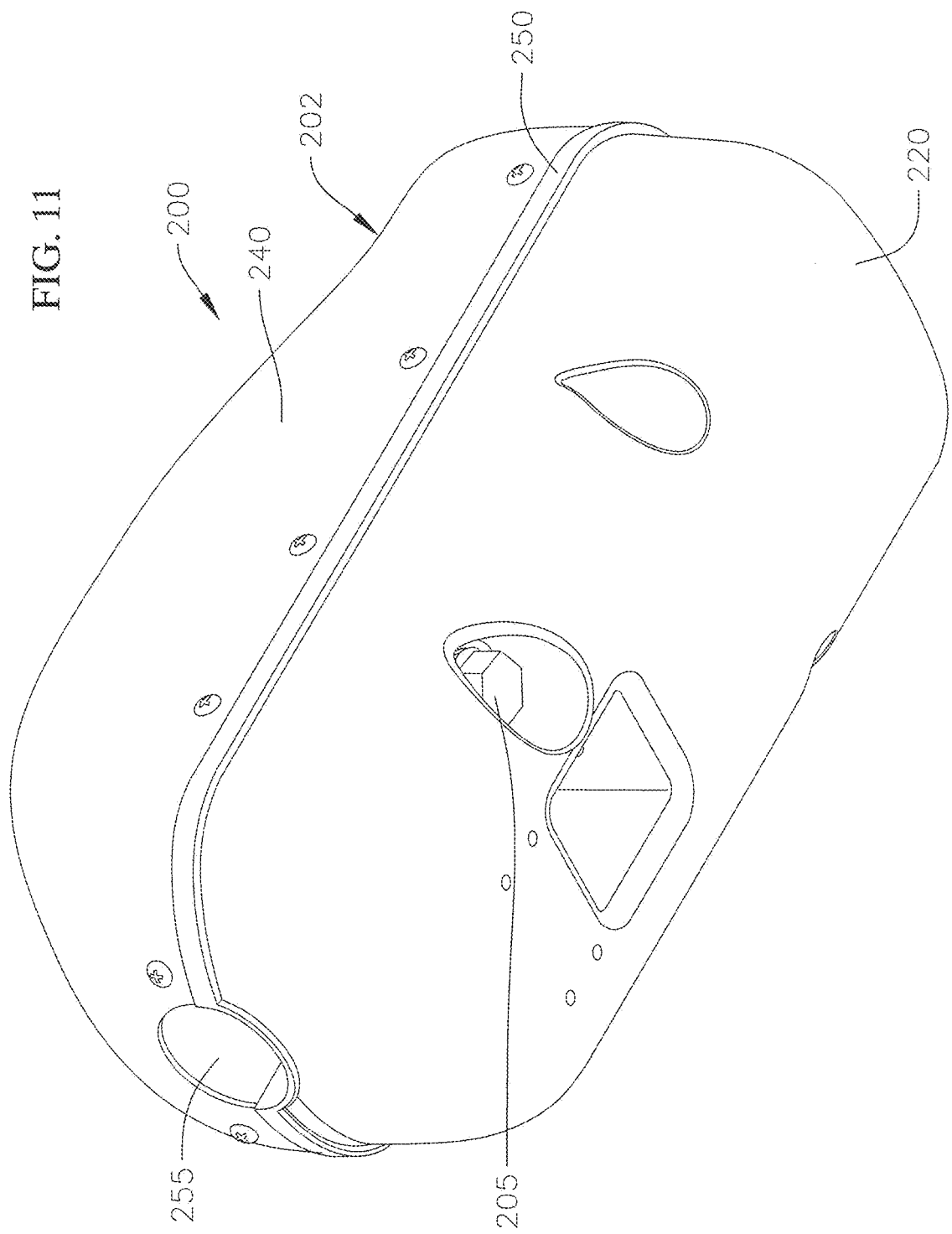
FIG. 11 is a bottom perspective view of the dropped conductor sensor according to another embodiment of the present invention.

According to an embodiment of the present invention, the dropped conductor sensor 200 is small and lightweight, further facilitating easy installation of the dropped conductor sensor 200 on the conductor 8. For example, the dropped conductor sensor may have a length of about 16 inches or less and a weight of less than 25 pounds. However, according to embodiments of the present invention, the dimensions and weight are not limited thereto. With reference to FIGS. 11 and 12, the dropped conductor sensor 200 according to an embodiment of the present invention includes a housing 202 including a base portion 220 and a cover portion 240 together defining a cavity in which a sensor, such as an accelerometer, and an antenna are housed. The housing 202 may be moved between an open position and a closed position for installing the dropped conductor sensor 200 on the conductor 8 via a travel bolt 205. The housing 202 may be formed of a semiconductive material, and a non-conductive inner portion 250 may be provided therein with a channel 255 for receiving a length of the conductor 8. In one embodiment, the dropped conductor sensor 200 may have a same or similar configuration as a transmission line monitor disclosed in U.S. patent application Ser. No. 13/796,614, the entire content of which is incorporated herein by reference, but may differ in that the dropped conductor sensor 200 may have one or more sensors for measuring at least one of an acceleration, a vibration, a tilt, a roll, or an angular displacement, but may not have additional sensors such as temperature, distance, current, or position sensors. However, embodiments of the present invention are not limited thereto.

Figure 13B:
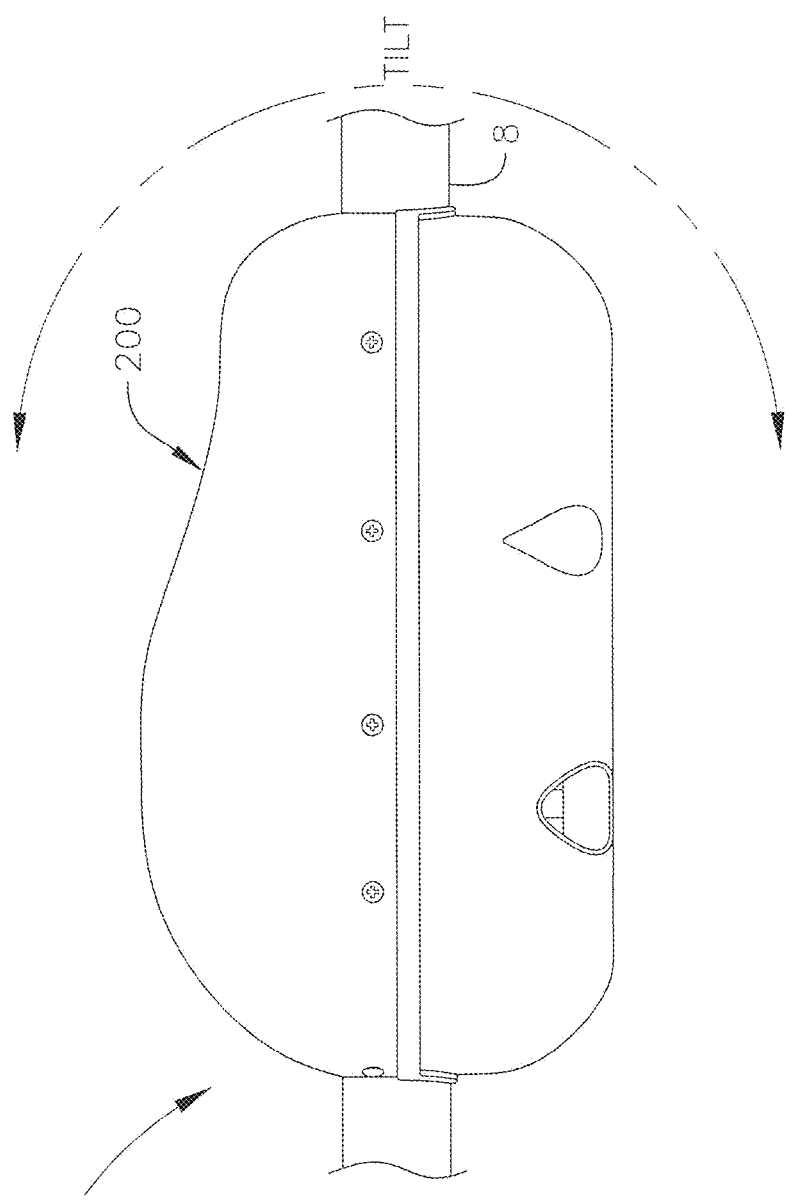
FIG. 13 shows a side view and a front view of the dropped conductor sensor of FIG. 11.
Figure 13A:
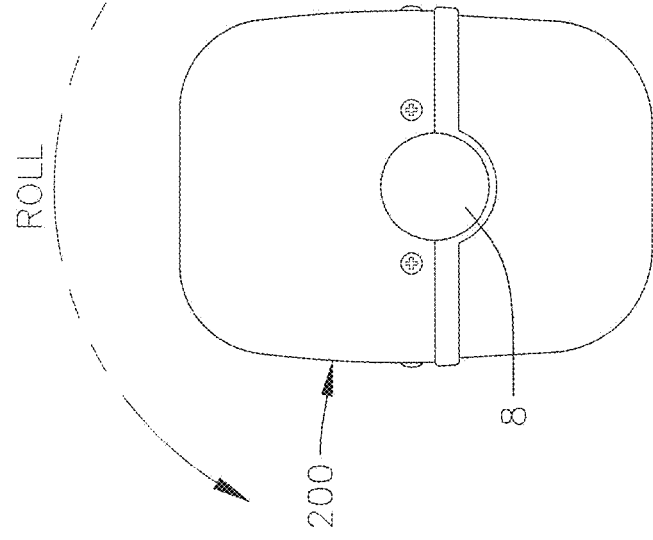

With reference to FIG. 13, a roll and a tilt of the dropped conductor sensor 200 installed on the conductor 8 are illustrated, according to an embodiment of the present invention. The dropped conductor sensor 200, in one embodiment, may detect and/or measure an amount of the tilt via an accelerometer (e.g., a MEMS accelerometer) or another suitable sensor housed within the housing 202. Further, the dropped conductor sensor 200, in one embodiment, may detect and/or measure an amount of the roll via the accelerometer or another suitable sensor. Because the dropped conductor sensor 200 is installed on the conductor 8 at a location thereof, a tilt and/or roll of the conductor 8 at the location where the dropped conductor sensor 200 is installed may be derived from the measured tilt and/or roll of the dropped conductor sensor 200. Roll and tilt of the conductor 8 may be caused by wind or precipitation, for example, and more dramatically by breakage of the conductor 8 or a collapse of the tower 15.

Figure 14:
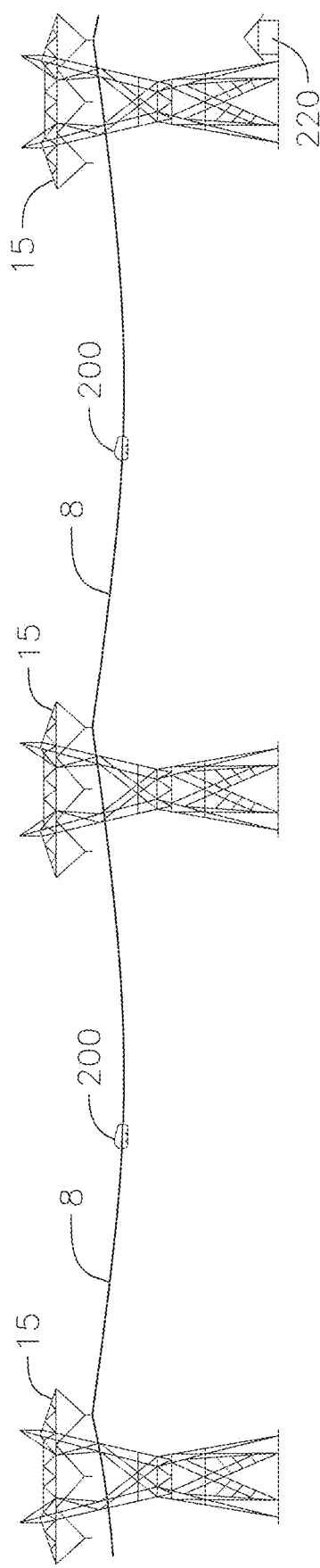
FIG. 14 is a schematic view of a monitoring system according to another embodiment of the present invention.

With reference to FIG. 14, a dropped conductor sensor monitoring system according to another embodiment of the present invention includes one or more of the dropped conductor sensors 200 and a monitoring station 220. Each of the one or more dropped conductor sensors 200 may have a same or similar configuration. In one embodiment, a plurality of the dropped conductor sensors 200 may be installed at different locations along the same conductor 8 that is supported by towers 15, as depicted in FIG. 14. However, the present invention is not limited thereto, and, in another embodiment, at least two of the dropped conductor sensors 200 may be installed on separate conductors 8, as shown in FIG. 8, for example. Each of the dropped conductor sensors 200 includes one or more sensors configured to sense in real time at least one of an acceleration, a tilt, a roll, a vibration, and/or an angular displacement of the conductor 8. In one embodiment, the dropped conductor sensor 200 may be configured to send a signal containing information of acceleration, a tilt, a roll, a vibration, and/or an angular displacement of the conductor 8 sensed by the sensor of the dropped conductor sensor 200 to the monitoring station 220, a satellite, and/or another one of the dropped conductor sensors 200. That is, one of the dropped conductor sensors 200 may send a signal to another one of the dropped conductor sensors 200, such as a nearest one of the dropped conductor sensors 200. In this manner, the dropped conductor sensors 200 may relay signals to the monitoring station 220 across a great distance. The monitoring station 220 may include a computer configured to analyze and store the information received from one or more of the dropped conductor sensors 200, as well as produce screen prints displaying the information. According to another embodiment of the present invention, the dropped conductor sensor monitoring system may include only one dropped conductor sensor 200 and the monitoring station 220, and the one dropped conductor sensor 200 may send a signal containing information of acceleration, tilt, and/or roll of the conductor 8 sensed by a sensor of the dropped conductor sensor 200 to the monitoring station 220.

Figure 15:
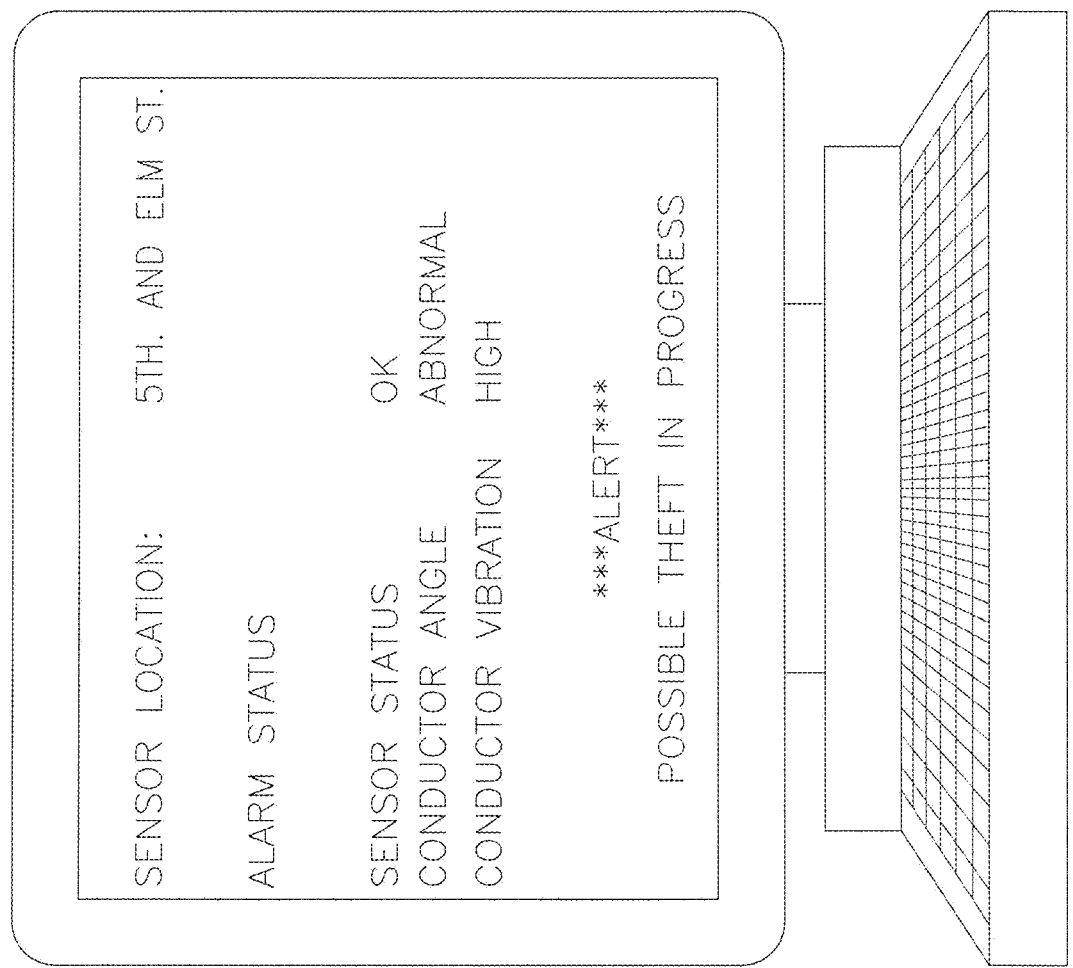
FIG. 15 is a diagram of a dashboard used to monitor a dropped conductor sensor, according to an embodiment of the present invention.
Figure 16:
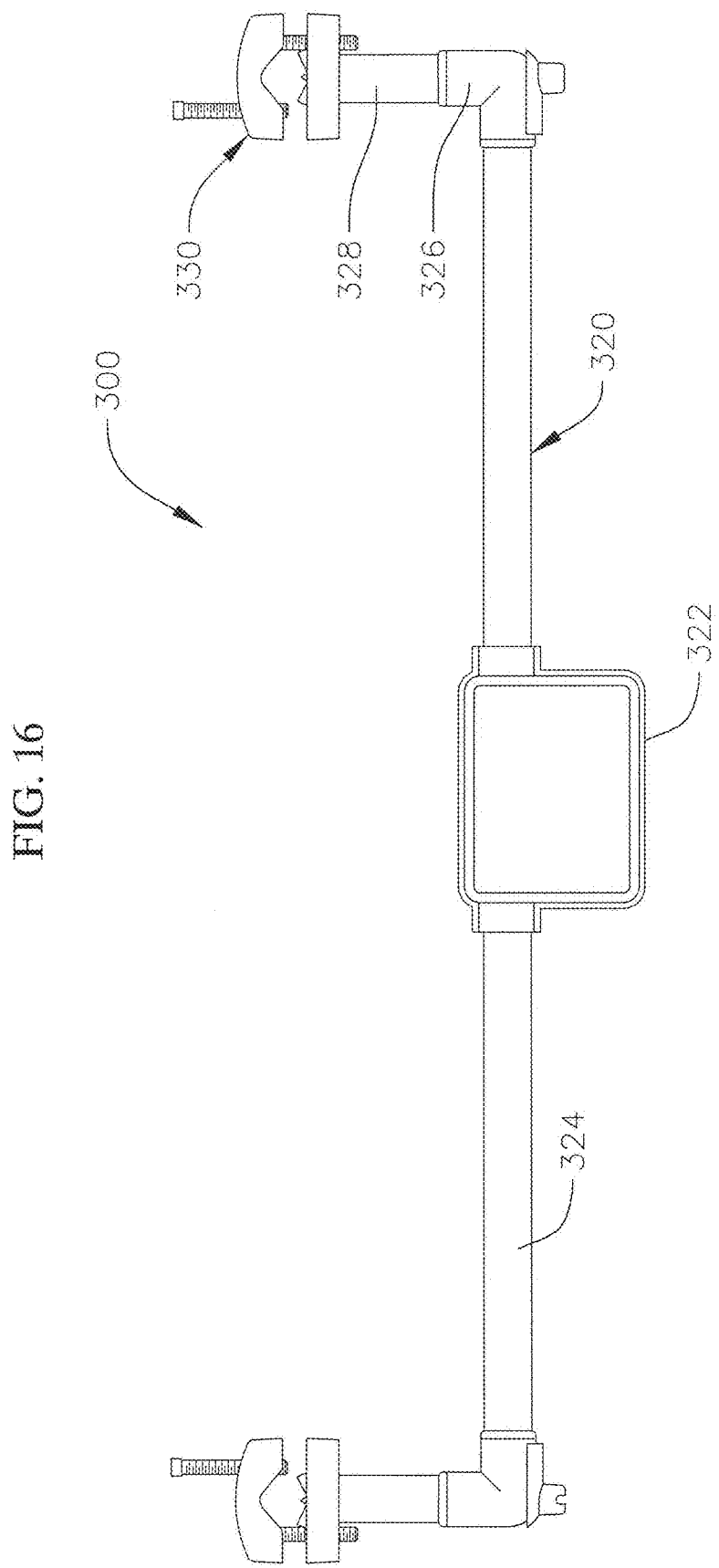
FIG. 16 is a front view of a dropped conductor sensor according to another embodiment of the present invention.
Figure 17:
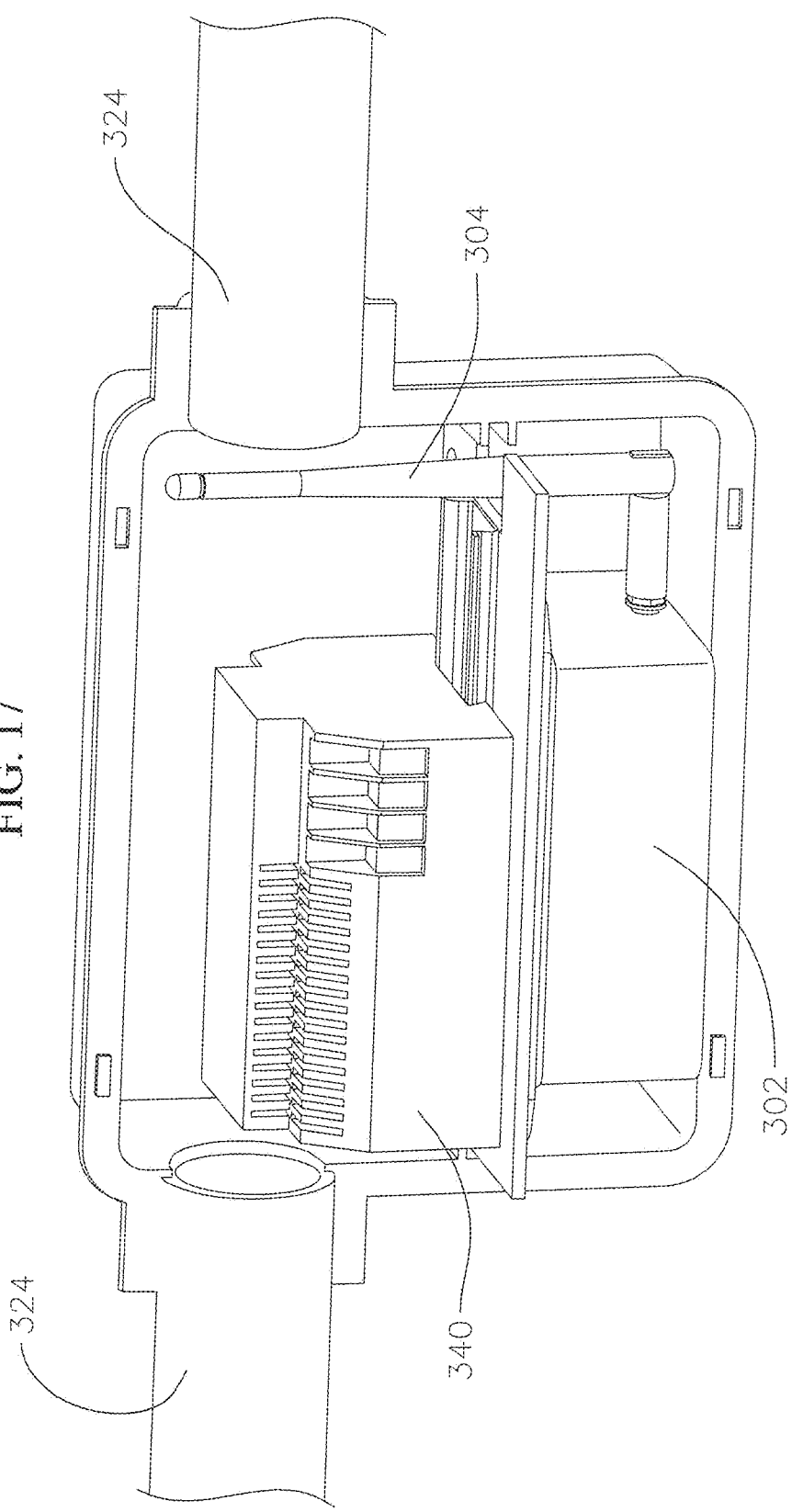
FIG. 17 is a partial cross-sectional view of the dropped conductor sensor of FIG. 16.
Figure 18C:
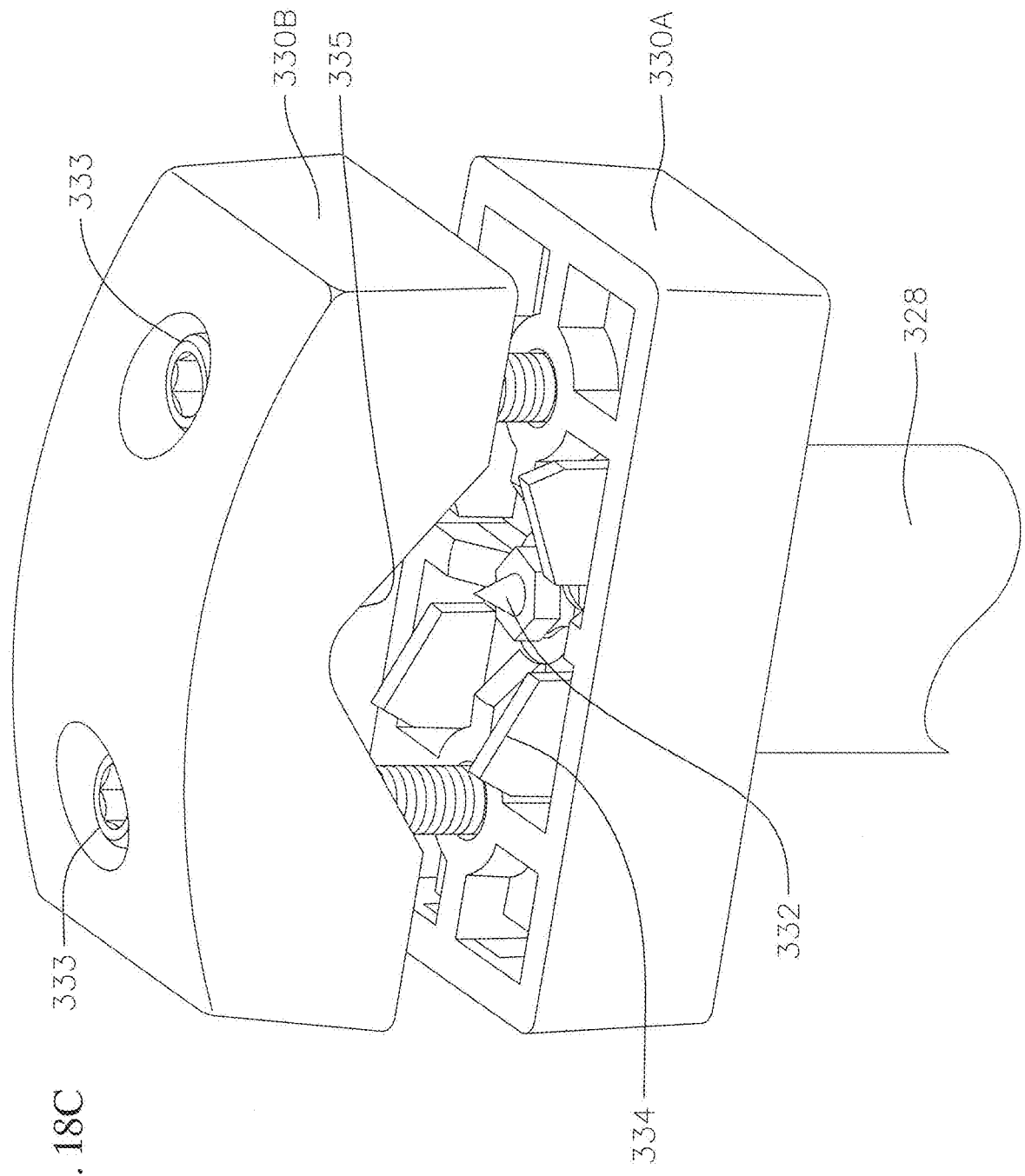
FIG. 18C is an enlarged view of the clamping portion of FIGS. 18A and 18B.

With reference to FIG. 15, according to an embodiment of the present invention, a dashboard may be used to monitor a dropped conductor sensor. For example, the dashboard may display real-time data, such as angular displacement values of the dropped conductor sensor 100, obtained from the signal received from the antenna. The dashboard may be located at a monitoring station, and the signal may be transmitted to the monitoring station directly or indirectly, such as through a satellite or one or more additional dropped conductor sensors or monitoring devices. The dashboard may include a computer configured to analyze and store the information received from one or more of the dropped conductor sensor 100, as well as produce screen prints displaying the information. For example, the dashboard may be configured to calculate an acceleration value based on the signal from the accelerometer. Additionally, the dashboard may be configured to display or send information, such as an alarm or other signal of an abnormal condition, and further may indicate the location of the abnormal condition, such as via a GPS or similar positioning device of the dropped conductor sensor 100. In one embodiment, the dropped conductor sensor 100 may be remotely programmable, such as via the dashboard.

With reference to FIGS. 16 to 18C, according to another embodiment of the present invention, a dropped conductor sensor 300 includes a housing 320, a sensor 302 configured to sense in real time at least one of an acceleration, a vibration, a tilt, a roll, or an angular displacement of the dropped conductor sensor 300. The dropped conductor sensor, in one embodiment, further includes an antenna 304 configured to transmit a signal including information sensed by the sensor 302 away from the dropped conductor sensor 300 in real time. Similar to the housing 120 of the dropped conductor sensor 100 described above, the housing 320 of the dropped conductor sensor 300 is installable on a conductor 50 via a supporting portion 330. The sensor 302 and the antenna 304 may be housed in an enclosure portion 322 of the housing 320, and, in one embodiment, the sensor 302 may be housed in a sensor housing that is mounted within the enclosure portion 322 of the housing 320. In one embodiment, the enclosure portion 322 may include a pair of enclosure portion sections coupled to each other and together defining a cavity to house the sensor 102 and the antenna 104.

In one embodiment, the sensor 302 is configured to measure an acceleration of the dropped conductor sensor 300 such that a sudden drop of the conductor 50 from which the dropped conductor sensor 300 is supported may be detected, and the sensor 302 may be a microelectromechanical system (MEMS) accelerometer. However, the present invention is not limited thereto and, in other embodiments, the sensor 302 may include one or more sensors configured to measure at least one of an acceleration, a vibration, a tilt, a roll, or an angular displacement of the dropped conductor sensor 300.

The housing 320 may be insulative, such as formed of a thermoplastic material or fiberglass. In one embodiment, the housing 320 further includes a pair of first extending portions 324 extending away from opposite sides of the enclosure portion 322, a pair of elbow portions 326 at ends of the respective first extending portions 324 opposite the enclosure portion, and a pair of second extending portions 328 extending upward from the respective elbow portions 326. In an embodiment, the first extending portions 324, the elbow portions 326, and the second extending portions 328 may be tubular and may house wiring to electrically connect the sensor 302 to the conductor 50.

As described above with respect to the dropped conductor sensor 100, the dropped conductor sensor 300 is configured to be supported from the conductor 50. In one embodiment, the dropped conductor sensor 300 is configured to be supported at one side from a first conductor 50 and at another side from a second conductor 50. As such, the dropped conductor sensor 300 may bridge a gap between the first and second conductors 50 such that if one or both of the first and second conductors 50 drops, the dropped conductor sensor 300 will detect the drop.

The dropped conductor sensor 300 may include the supporting portion 330 coupled to the housing 320 and configured to engage, receive, or otherwise be supported on or from the conductor 50. In an embodiment, the supporting portion 330 is configured to clamp to the conductor 50 and may include a base portion 330A and a clamping portion 330B configured to be moved relative to the base portion 330A and clamp the conductor 50 therebetween, such as via one or more fasteners 333. In an embodiment, the base portion 330A may include one or more supporting portions 334, which may be downwardly inclined or concave to stably support a lower side of the conductor 50, and the clamping portion 330B may include a recessed lower surface 335 to support an upper side of the conductor 50. Further, the supporting portion 330 may be electrically conductive (e.g., a metal) and may include a connector 332 to electrically connect to a core (e.g., a copper core) of the conductor 50, such as by piercing an insulative jacket of the conductor 50. In an embodiment, the dropped conductor sensor 300 includes a first supporting portion 330 coupled to a first end of the housing 320 and configured to engage and be supported on the first conductor 50, and a second supporting portion 330 coupled to a second end of the housing 320 and configured to engage and be supported on the second conductor 50. In an embodiment, the supporting portion 330 is rotatably coupled to the second extending portion 328 of the housing 320, such that the housing 320 may be oriented at any of various angles relative to the conductor 50, as illustrated and described below with respect to FIGS. 19A to 19D.

In an embodiment, the dropped conductor sensor 300 is electrically connected to the conductor 50 such that the sensor 302 may be powered by the conductor 50. In an embodiment, the conductor is a 600 V DC copper conductor; however, embodiments of the present invention are not limited thereto. The dropped conductor sensor 300 may include a step-down device 340, such as a 600 V DC to 24 V DC converter, electrically connected, such as via wiring between the conductor 50 and the sensor 302. Further, the dropped conductor sensor 300 may include a current limiting resistor electrically connected between the step-down device 340 and the sensor 302, for example, similar to the current limiting resistor 150 of the dropped conductor sensor 100 described above.

According to an embodiment, the dropped conductor sensor 300 may further include a GPS or similar positioning device configured to provide information of the location of the dropped conductor sensor 300. For example, in a system including a plurality of the dropped conductor sensors 300, a GPS or similar positioning device would allow a user to quickly and easily locate and repair the conductor 50 associated with the particular dropped conductor sensor 300.

Figure 19B:
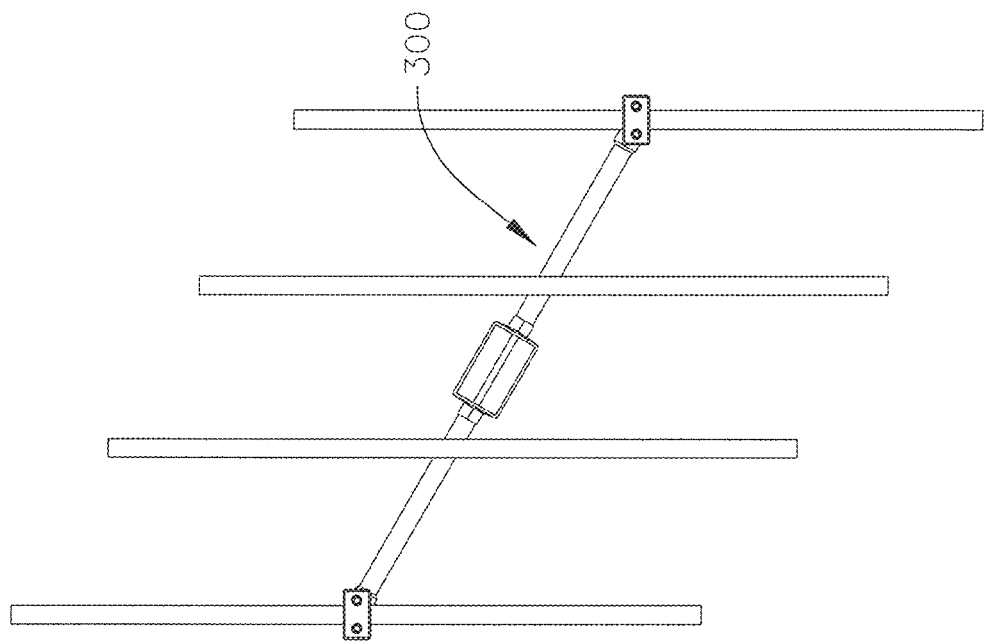
FIGS. 19A to 19D are top views of the dropped conductor sensor of FIG. 16 supported on various arrangements of conductors, according to some embodiments of the present invention.
Figure 19A:
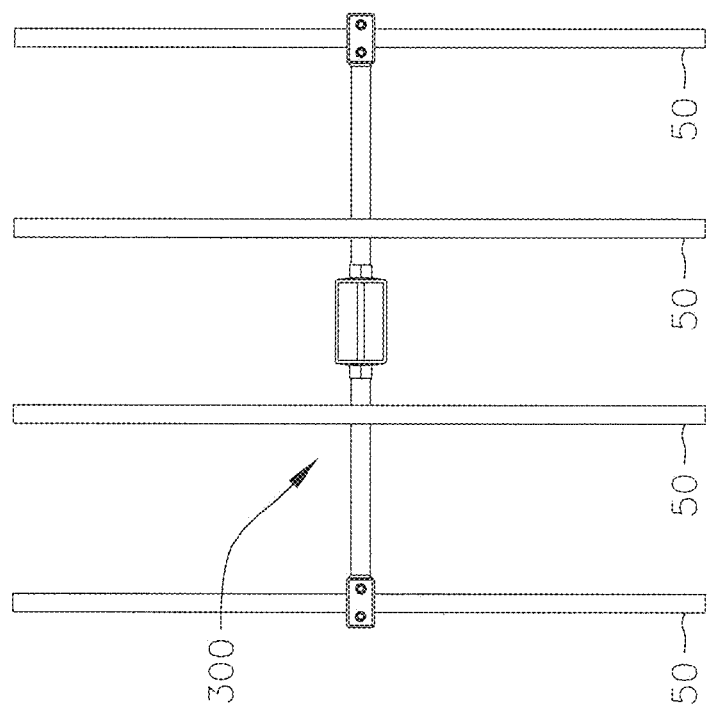
Figure 19D:
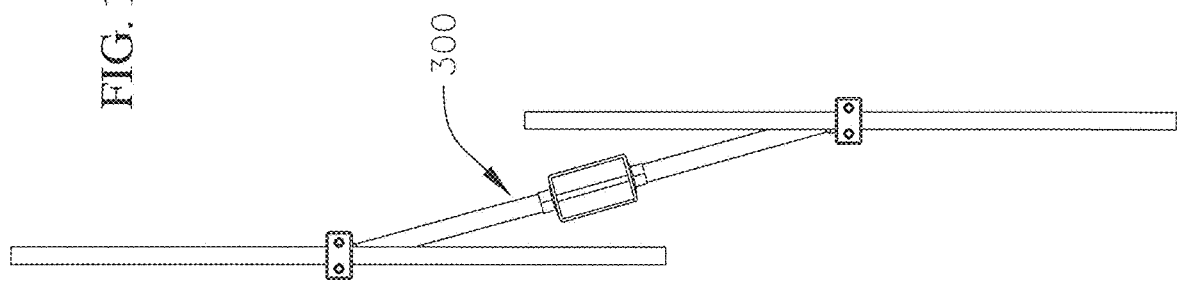
Figure 19C:
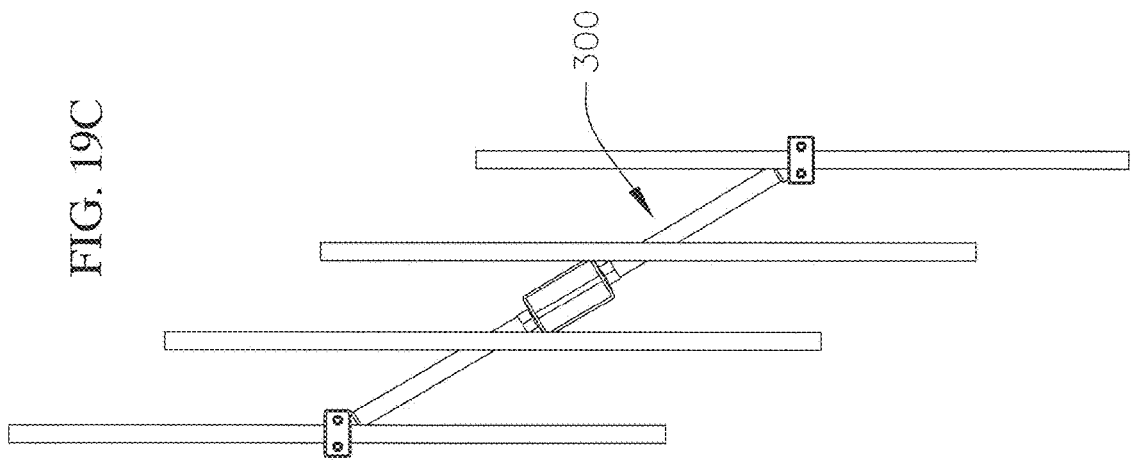

With reference to FIGS. 19A to 19D, the dropped conductor sensor 300 is shown being supported between conductors or cables having different spacings. That is, as shown in FIG. 19A, the dropped conductor sensor 300 may be supported between conductors having a spacing of 16 inches and may be mounted to a pair of outermost conductors among four such conductors, such that the dropped conductor sensor 300 extends perpendicular to a direction in which the conductors extend. Similarly, as shown in FIG. 19B, the dropped conductor sensor 300 may be supported between conductors having a spacing of 14 inches and may be mounted to a pair of outermost conductors among four such conductors, but may be oriented at an oblique angle relative to the conductors. As shown in FIG. 19C, the dropped conductor sensor 300 may be supported between conductors having a spacing of 8 inches and may be mounted to a pair of outermost conductors among four such conductors, such that the dropped conductor sensor 300 is oriented at an oblique angle relative to the conductors greater than the angle shown in FIG. 19B. In another configuration, as shown in FIG. 19D, the dropped conductor sensor 300 may be supported between and mounted to two conductors having a spacing of 13 inches, such that the dropped conductor sensor 300 is oriented at an oblique angle relative to the conductors greater than the angles shown in FIGS. 19B and 19C. However, the present invention is not limited to the above-described configurations and conductor spacings, nor the above described numbers of conductors. Accordingly, the dropped conductor sensor 300 may be mounted to any of various arrangements and spacings of conductors. Further, as illustrated in FIGS. 19A to 19C, the dropped conductor sensor 300 may be mounted to a pair of outer conductors with one or more other conductors passing over the dropped conductor sensor 300, such that a breakage or disturbance of any of the one or more other conductors passing over the dropped conductor sensor 300 may also be detected by the dropped conductor sensor 300. In an embodiment, for example, a breakage of one of the conductors 50 may cause breakage or bending of the housing 320, which may be made of a plastic material, such as PVC, for example.

According to an embodiment of the present invention, a method of monitoring a conductor using a dropped conductor sensor, such as one of the dropped conductor sensors 1A, 1B, 100, 100', 200, 300 described above, includes a task of installing the dropped conductor sensor on a conductor. The dropped conductor sensor is installed on a length of the conductor, such as a conductor having a suitable diameter and voltage.

For example, the conductor may be a copper conductor and may have a voltage of 600 V DC, and, in an embodiment, may be a pair of conductors spaced apart from each other by a distance (e.g., two feet). However, embodiments of the present invention are not limited thereto. In the task of installing the dropped conductor sensor on the conductor, the dropped conductor sensor may be hooked or clamped onto the conductor or pair of conductors via one or more of the supporting portions described above.

The method, in one embodiment, includes a task of powering the dropped conductor sensor using the conductor. The dropped conductor sensor may include the converter (e.g., a 600V to 24V DC/DC converter) to power the devices of the dropped conductor sensor (e.g., the sensor and a GPS device) using voltage of the conductor. The method further includes a task of sensing an acceleration, a tilt, a roll, a vibration, and/or an angular displacement of the dropped conductor sensor in real time. In one embodiment, a sudden drop of the conductor is sensed using the accelerometer, which may be a MEMS accelerometer. However, the present invention is not limited thereto, and may include a vibration sensor or any other suitable sensor.

The method further includes a task of transmitting a signal, such as directly or indirectly to a monitoring station. The signal including information sensed by the sensor (e.g., the accelerometer) is transmitted from the dropped conductor sensor by the antenna in real time. In one embodiment, the antenna may transmit a radio wave signal to a monitoring station. In another embodiment a physical wired connection such as by copper wires, for example, may be made between the sensor and the monitoring station. The monitoring station, or control center, may be any suitable station configured to receive the signal from the antenna of the dropped conductor sensor. In one embodiment, the dropped conductor sensor may transmit a signal to more than one monitoring station or to one or more intermediate devices, such as a satellite or other dropped conductor sensor.

The method according to an embodiment further includes a task of monitoring information transmitted to the monitoring station. As discussed above, the monitoring station, or control center, may be any suitable station configured to receive the signal from one or more of the dropped conductor sensors. The monitoring station may include a computer for storing and analyzing information data received from the one or more dropped conductor sensors, as well as for producing alarms and/or screen prints displaying the information, or for further processing or communicating the information to a user. In one embodiment, the real time information is received by the monitoring station and monitored as the real time information itself.

Although the drawings and accompanying description illustrate some exemplary embodiments of a dropped conductor sensor and a method of monitoring a conductor using the same, it will be apparent that the novel aspects of the present invention may also be carried out by utilizing alternative structures, sizes, shapes, and/or materials in embodiments of the present invention. Also, aspects and/or components described above with respect to one embodiment may be included together with or interchanged with those of other embodiments.

The preceding description has been presented with reference to certain embodiments of the invention. Persons skilled in the art and technology to which this invention pertains will appreciate that alterations and changes in the described structures and methods of operation can be practiced without meaningfully departing from the principles, spirit, and scope of this invention.

What is claimed is:

1. A dropped conductor sensor comprising:
   a housing installable on a first conductor;
   supporting portions coupled to opposite sides of the housing; and
   a sensor supported in the housing and configured to sense in real time at least one of an acceleration, a vibration, a tilt, a roll, or an angular displacement of the dropped conductor sensor, the sensor being housed in a cavity of the housing that is located between the supporting portions,
   wherein the housing is installable on both the first conductor and a second conductor at respective lengths of the first conductor and the second conductor that extend continuously along respective first and second axes of the first and second conductors that are spaced apart from each other, and wherein the housing is supportable from the first conductor and the second conductor via the supporting portions so as to bridge a gap between the first conductor and the second conductor along a direction crossing each of the first and second axes.

2. The dropped conductor sensor of claim 1, further comprising an antenna in the housing, the antenna configured to transmit a signal including information sensed by the sensor away from the dropped conductor sensor in real time.

3. The dropped conductor sensor of claim 1, further comprising an AC/DC or DC/DC converter electrically connected between the first conductor and the sensor.

4. The dropped conductor sensor of claim 3, further comprising a current limiting resistor electrically connected between the AC/DC or DC/DC converter and the sensor.

5. The dropped conductor sensor of claim 1, wherein the supporting portions have at least one of a hook shape or a clamp shape having a recess configured to receive the respective first and second conductors.

6. The dropped conductor sensor of claim 1, wherein a supporting portion of the supporting portions comprises an electrically conductive material and is electrically connected between the first conductor and the sensor.

7. The dropped conductor sensor of claim 1, wherein the dropped conductor sensor comprises a pair of clamping portions configured to clamp on the first conductor and the second conductor.

8. The dropped conductor sensor of claim 7, wherein each of the pair of clamping portions is rotatably coupled to the housing.

9. The dropped conductor sensor of claim 1, wherein the sensor comprises an accelerometer.

10. The dropped conductor sensor of claim 1, wherein the housing comprises a base portion, and a cover portion coupled to the base portion and defining the cavity of the housing together with the base portion.

11. The dropped conductor sensor of claim 10, wherein the base portion and the cover portion are electrically insulative.

12. A monitoring system comprising:
a dropped conductor sensor comprising:
- a housing installable on a first conductor;
- supporting portions coupled to opposite sides of the housing;
- a sensor supported in the housing and configured to sense in real time at least one of an acceleration, a vibration, a tilt, a roll, or an angular displacement of the dropped conductor sensor, the sensor being housed in a cavity of the housing that is located between the supporting portions; and
- an antenna in the housing, the antenna configured to transmit a signal including information sensed by the sensor away from the dropped conductor sensor in real time,
- wherein the housing is installable on both the first conductor and a second conductor at respective lengths of the first conductor and the second conductor that extend continuously along respective first and second axes of the first and second conductors that are spaced apart from each other, and wherein the housing is supportable from the first conductor and the second conductor via the supporting portions so as to bridge a gap between the first conductor and the second conductor along a direction crossing each of the first and second axes; and a remote receiving device receiving the signal from the dropped conductor sensor.

13. The monitoring system of claim 12, wherein the remote receiving device comprises at least one of a monitoring station, a satellite, or another dropped conductor sensor.

14. A method of monitoring a conductor using a dropped conductor sensor, the method comprising:

providing a dropped conductor sensor on a first conductor;

sensing in real time at least one of an acceleration, a vibration, a tilt, a roll, or an angular displacement of the dropped conductor sensor using a sensor of the dropped conductor sensor that is supported in a housing of the dropped conductor sensor; and transmitting a signal including information sensed using the sensor to a remote receiving device in real time, wherein the housing is installed on both the first conductor and a second conductor at respective lengths of the first conductor and the second conductor that extend continuously along respective first and second axes of the first and second conductors that are spaced apart from each other, and wherein the housing is supported from the first conductor and the second conductor via supporting portions of the dropped conductor sensor that are coupled to opposite sides of the housing so as to bridge a gap between the first conductor and the second conductor along a direction crossing each of the first and second axes, the sensor being housed in a cavity of the housing that is located between the supporting portions.

15. The method of claim 14, wherein supporting the dropped conductor sensor on the first and second conductors comprises clamping respective supporting portions of the dropped conductor sensor on each of the first and second conductors.

16. The method of claim 14, wherein the remote receiving device comprises at least one of a monitoring station, a satellite, or another dropped conductor sensor.

* * * * *